United States Patent
Mukhopadhyay et al.

(10) Patent No.: US 10,216,575 B2
(45) Date of Patent: Feb. 26, 2019

(54) DATA CODING

(71) Applicant: SANDISK TECHNOLOGIES LLC, Addison, TX (US)

(72) Inventors: Rishi Gautam Mukhopadhyay, Bangalore (IN); Rajesh Kumar Neermarga, Bangalore (IN); Abhijeet Manohar, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 135 days.

(21) Appl. No.: 15/073,215

(22) Filed: Mar. 17, 2016

(65) Prior Publication Data
US 2017/0269876 A1    Sep. 21, 2017

(51) Int. Cl.
| | |
|---|---|
| G11C 29/00 | (2006.01) |
| G06F 11/10 | (2006.01) |
| G11C 16/10 | (2006.01) |
| G11C 16/26 | (2006.01) |
| G11C 7/10 | (2006.01) |
| G11C 11/56 | (2006.01) |

(52) U.S. Cl.
CPC ........ G06F 11/1072 (2013.01); G11C 7/1006 (2013.01); G11C 11/5628 (2013.01); G11C 11/5642 (2013.01); G11C 16/10 (2013.01); G11C 16/26 (2013.01)

(58) Field of Classification Search
CPC .... G06F 3/0661; G06F 3/0616; G06F 3/0625; G06F 3/0656; G06F 3/0659; G06F 3/0679; G06F 11/1072; G11C 7/1006; G11C 11/5628; G11C 11/5642; G11C 16/10

USPC ............... 714/764, 763, 767, 721, 752, 746
See application file for complete search history.

(56) References Cited

U.S. PATENT DOCUMENTS

| | | | |
|---|---|---|---|
| 6,226,333 B1 * | 5/2001 | Spalink | H04L 25/061 329/304 |
| 7,054,375 B2 * | 5/2006 | Kannan | H04L 1/0025 375/260 |
| 7,388,781 B2 | 6/2008 | Litsyn et al. | |
| 7,643,342 B2 | 1/2010 | Litsyn et al. | |
| 7,697,325 B2 | 4/2010 | Sprouse et al. | |
| 7,990,766 B2 | 8/2011 | Litsyn et al. | |
| 2008/0031042 A1 | 2/2008 | Sharon | |
| 2008/0158948 A1 | 7/2008 | Sharon et al. | |
| 2010/0180179 A1 | 7/2010 | Lastras-Montano | |
| 2010/0281340 A1 | 11/2010 | Franceschini et al. | |
| 2010/0284537 A1 | 11/2010 | Inbar | |

(Continued)

FOREIGN PATENT DOCUMENTS

WO    2010092536 A1    8/2010

*Primary Examiner* — Christine T. Tu
(74) *Attorney, Agent, or Firm* — Michael Best & Friedrich LLP

(57) ABSTRACT

A data storage device includes an encoder and a memory that includes multiple storage elements. The encoder is configured to receive input data and to map at least one input group of bits of the input data to generate output data including at least one output group of bits. Each input group of bits of the at least one input group of bits and each output group of bits of the at least one output group of bits has the same number of bits. Each storage element of the multiple storage elements is configured to be programmed to a voltage state corresponding to an output group of bits of the at least one group of bits associated with the storage element.

14 Claims, 9 Drawing Sheets

(56) References Cited

U.S. PATENT DOCUMENTS

| | | |
|---|---|---|
| 2011/0029754 A1 | 2/2011 | Litsyn et al. |
| 2011/0093652 A1 | 4/2011 | Sharon et al. |
| 2011/0138104 A1 | 6/2011 | Franceschini et al. |
| 2011/0138105 A1 | 6/2011 | Franceschini et al. |
| 2011/0276749 A1 | 11/2011 | Litsyn et al. |
| 2016/0336968 A1* | 11/2016 | Banister ............. H03M 13/1148 |

* cited by examiner

DATA CODING

FIELD OF THE DISCLOSURE

This disclosure is generally related to coding (e.g., encoding or decoding) of data.

BACKGROUND

A memory, such as a flash memory, may have limited endurance to write/erase (W/E) cycles and may have limited data retention. As a number of W/E cycles performed in a flash memory increases, a data retention capability of the memory may be reduced and a possibility of failures may increase. For example, programming storage elements to have a high threshold voltage (e.g., corresponding to a logical "0" value) may cause faster wearing of the storage elements as compared to programming the storage elements to a lower threshold voltage or retaining the storage elements in an erased state (e.g., corresponding to a logical "1" value). To illustrate, an oxide insulation layer may wear due to electrons that pass through the oxide insulation layer during W/E cycles and generate electron trap sites. A failure may manifest as a failure to erase or program a block of the memory or may manifest as reduced data retention ability of memory cells, as illustrative examples.

In some flash memory fabrication processes, as storage element dimensions shrink, W/E cycling endurance may be reduced and may become a limiting factor that may affect commercial viability of the flash memory. For example, as memory technology is scaled down, a bit error rate (BER) of data storage of the memory generally increases. Moreover, in some cases, there may be special blocks of a flash memory, such as blocks used by flash management software or blocks used for binary caching, that experience more W/E cycles than the rest of the memory and that may be disproportionately affected by W/E cycle endurance of the memory.

Conventional approaches to control memory endurance degradation are applicable to single-level cell (SLC) type memory and rely on data (to be stored at the memory) being compressible. For example, a first conventional approach to compensate for wearing and to extend an endurance of a memory includes processing and encoding data to be stored at the memory to have more logical 1s (corresponding to a low threshold voltage) than logical 0s (corresponding to a high threshold voltage). As another example, a second conventional approach to compensate for wearing and to extend an endurance of a memory includes having stronger error correction methods and more redundant bytes. As indicated above, these conventional approaches are applicable to SLC type memory and also rely on the original data being compressible. When the conventional approaches are applied to multi-level cell (MLC) memories and all the pages of a memory word line (WL) are programmed, storage elements may be programmed to high voltage state despite the conventional approaches being applied. The programming of the storage elements to the high voltage states may cause wearing of the memory and reduce endurance of the memory.

DETAILED DESCRIPTION

Figure 1:
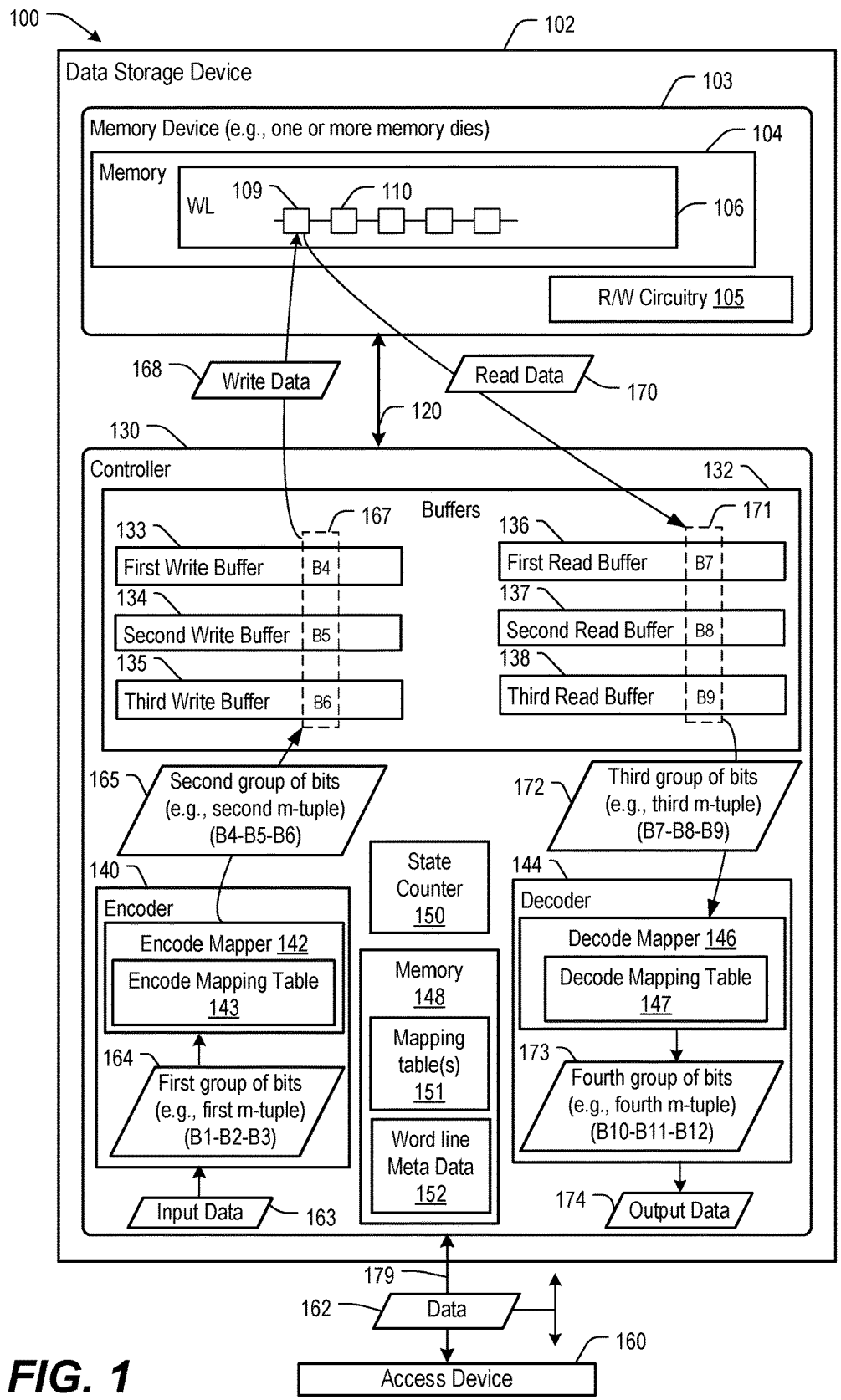
FIG. 1 is a block diagram of an example of a system operative to perform shaping transformation coding.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "exemplary" may indicate an example, an implementation, and/or an aspect, and should not be construed as limiting or as indicating a preference or a preferred example, implementation, and/or aspect. As used herein, an m-tuple of bits refers to a string of m bits where m is a positive integer that is greater than one. Hereinafter, an m-tuple of bits may be referred to as an "m-tuple" or as a "group of bits". A number of bits in an m-tuple may be associated with a stored voltage state of a single storage element of a memory. For example, in some implementations, m=2 for a storage element configured a multi-level cell (MLC) storage element (e.g., storing 2 bits per storage element). As another example, m=3 for a storage element configured a tri-level cell (TLC) storage element (e.g., storing 3 bits per storage element). As another example, m=4 for a storage element configured to store 4 bits per storage element.

The present disclosure describes systems, devices, and methods of coding (e.g., encoding, decoding, or both) data. Input data to be stored at a memory may be divided into groups of bits (e.g., groups of multiple bits, such as two bits per group, three bits per group, four bits per group, etc.) and each group of bits may be mapped by an encoder to a corresponding output group of bits. For example, each group of bits may be mapped using a mapping table, such as a static mapping table or a dynamic mapping table (based on frequency of occurrence of bit values for each group of bits). Each output group of bits may be arranged so that a storage element may be programmed to a voltage state corresponding to the output group of bits. For example, prior to programming a particular storage element, each bit of a particular output group of bits may be provided to a different buffer of a set of buffers. Each buffer may correspond to a different logical page associated with the storage element. The particular storage element may be programmed to a voltage state based on the bit values of the particular output group of bits stored at the buffers. By programming storage elements to voltage states corresponding to encoded groups of bits, the storage elements may be programmed (on average) to lower threshold voltage levels as compared to programming the storage elements to voltage states corresponding to unencoded groups of bits.

Programmed storage elements may be read to generate read data that includes multiple groups of bits (e.g., each group of bits corresponding to a different storage element). Each group of bits (of the read data) may be mapped by a decoder to a corresponding decoded group of bits. For example, each group of bits may be mapped using a mapping table, such as a static mapping table or a dynamic mapping table.

The systems, devices, and methods of the present disclosure may reduce wear to the memory and increase longevity of the memory by mapping a group of bits of input data to an encoded group of bits and programming a storage element to a voltage state corresponding to the encoded group of bits. For example, by programming storage elements to voltage states corresponding to encoded groups of bits, the storage elements may be programmed (on average) to lower threshold voltage levels which may reduce stress on the storage elements and thus increase an endurance limit of the memory. Additionally, the systems, devices, and methods described herein may enable encoding that may be performed independent of any pre-preprocessing, such as shaping, scrambling, or compression, that may be performed on data prior to the data being received by an encoder. The techniques describe herein may be applied on-the-fly to an input data stream to produce a corresponding output data stream which solely depends on the input data stream.

FIG. 1 depicts an illustrative example of a system 100 that includes a data storage device 102 and an access device 160. The data storage device 102 includes a controller 130 (e.g., a memory controller) and a memory device 103 that is coupled to the controller 130. The memory device 103 may include a memory 104.

The controller 130 includes an encoder 140, a decoder 144, a memory 148, a state counter 150, and buffers 132. The controller 130 may receive or generate input data 163 to be stored at the memory device 103. The input data 163 may be provided to the encoder 140. The encoder 140 is configured to transform the input data 163 to generate encoded data. To transform the input data 163, the encoder 140 may initialize a transformation table (e.g., an encode mapping table 143) that is configured to indicate a mapping of a group of bits (of the input data 163) to an encoded group of bits (of the encoded data). The transformation table may be a static table in which the mapping of the group of bits (of the input data 163) to the encoded group of bits does not change. Alternatively, the transformation table may be a dynamic table (e.g., a frequency table) that is configured to indicate occurrences of different m-tuples included in the input data and to update a mapping of a group of bits (of the input data 163) to an encoded group of bits based on occurrence values, as described with reference to FIG. 2. For example, the dynamic table may be configured to map frequently encountered m-tuples to m-tuples that correspond to lower voltage states, while less-frequent m-tuples are mapped to m-tuples corresponding to higher voltage states. The occurrence values of different groups of bits (e.g., different m-tuples) may be maintained at the memory 148.

For each m-tuple of the input data 163, the encoder 140 may map the m-tuple to a corresponding output m-tuple (e.g., an encoded m-tuple) based on the transformation table. For example, the encoder may map a first m-tuple of the input data 163 to an encoded m-tuple. The encoded m-tuple may correspond to (e.g., indicate) a voltage state to be programmed to a storage element of the memory device 103. In some implementations, the encoder 140 may receive each bit of an m-tuple (of the input data 163) serially. In other implementations, the encoder 140 may receive each bit of an m-tuple (of the input data 163) in parallel, such as via multiple input ports of the encoder 140.

The bits of the encoded m-tuple may be arranged so that the voltage state corresponding to the encoded m-tuple is programmed to a storage element of the memory device 103. To illustrate, the encoder 140 may provide the encoded m-tuple to the buffers 132 and each bit of the encoded m-tuple may be stored in a different write buffer of a set of write buffers. Each write buffer of the set of write buffers may correspond to a different logical page of the storage element (e.g., correspond to a different logical page of a word line). A write operation may be performed to program a storage element of the memory to a voltage state based on the encoded m-tuple stored at the write buffers.

After the encoded m-tuple is stored to the memory device 103, a read operation may be performed on the storage element to generate a read m-tuple (e.g., a representation of the encoded data). Each read m-tuple may correspond to a voltage state of a different storage element of the memory device 103. For example, the read operation may read multiple storage elements of the memory device and may generate read data 170. The read data may be stored in a set of read buffers prior to being provided to the decoder 144. Each read buffer of the set of read buffers may correspond to a different logical page of the storage element (e.g., correspond to a different logical page of a word line). The read data stored at the multiple read buffers may include multiple read m-tuples. For each read m-tuple, each read buffer of the set of read buffers may include a different bit of the read m-tuple.

The decoder 144 is configured to transform the read data 170 to generate decoded data (e.g., output data 174). To transform the read data, the decoder 144 may initialize a transformation table (e.g., a decode mapping table 147) that is configured to indicate a mapping of a group of bits (of the read data) to a decoded group of bits (of the output data 174). The transformation table may be a static table or a dynamic table. An example of a dynamic decode transformation table is described with reference to FIG. 3. For each read m-tuple of the read data, the decoder 144 may map the read m-tuple to a corresponding decoded m-tuple based on the transformation table. In some implementations, the decoder 144 may receive each bit of a read m-tuple (of the read data) serially. In other implementations, the decoder 144 may receive each bit of a read m-tuple (of the read data) in parallel, such as in parallel from the buffers 132.

Coding (e.g., encoding and decoding) described herein may include a simple process that may be applied on-the-fly to a data stream. For example, decoding (performed by the decoder 144) may produce a corresponding output data stream which solely depends on an input data stream received at the decoder 144. Additionally, encoding (performed by the encoder 140) may produce a corresponding output data stream which solely depends on an input data stream received at the encoder 140. Further, the encoding described herein may be performed independent of any pre-preprocessing, such as shaping, scrambling, or compression, performed on data prior to the data being received by the encoder 140. Encoding may be performed without having to store additional side information for subsequent decoding of the encoded data. By not having to maintain side information for later decoding, latency attributable to maintaining side information is avoided while the input data is processed and transmitted to the memory 104 for storage. The encoded data may be generated and stored such that storage elements of the memory are programmed to voltage states that correspond to encoded m-tuples output by the encoder 140. By programming the storage elements to the voltage states corresponding to the encoded m-tuples, the storage elements may be programmed (on average) to lower threshold voltage levels, which may reduce stress on the storage elements and thus increase an endurance limit of the memory 104.

The data storage device 102 and the access device 160 may be coupled via a connection (e.g., a communication path 179), such as a bus or a wireless connection. The data storage device 102 may include a first interface (e.g., an access device interface) that enables communication via the communication path 179 between the data storage device 102 and the access device 160.

The access device 160 may include a memory interface (not shown) and may be configured to communicate with the data storage device 102 via the memory interface to read data from and write data to the memory device 103 of the data storage device 102. For example, the access device 160 may operate in compliance with a Joint Electron Devices Engineering Council (JEDEC) industry specification, such as a Universal Flash Storage (UFS) Access Controller Interface specification. As other examples, the access device 160 may operate in compliance with one or more other specifications, such as a Secure Digital (SD) Access Controller specification, as an illustrative, non-limiting example. The access device 160 may communicate with the memory device 103 in accordance with any other suitable communication protocol.

The access device 160 may include a processor and a memory. The memory may be configured to store data and/or instructions that may be executable by the processor. The memory may be a single memory or may include multiple memories, such as one or more non-volatile memories, one or more volatile memories, or a combination thereof. The access device 160 may issue one or more commands to the data storage device 102, such as one or more requests to erase data, to read data from, or to write data to the memory device 103 of the data storage device 102. For example, the access device 160 may be configured to provide data, such as data 162, to be stored at the memory device 103 or to request data to be read from the memory device 103.

The memory device 103 of the data storage device 102 may include one or more memory dies, such as one memory die, two memory dies, eight memory dies, or another number of memory dies. The memory device 103 includes the memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include multiple storage elements (e.g., also referred to herein as memory cells), such as one or more blocks of storage elements. For example, each of the blocks may include a NAND flash erase block. Each storage element of the memory 104 may be programmable to a state (e.g., a threshold voltage in a flash configuration or a resistive state in a resistive memory configuration) that indicates one or more values, such as one or more bit values. Each block of the memory 104 may include one or more word lines, such as a representative word line (WL) 106. Although the memory 104 is illustrated as including a single representative word line, in other implementations, the memory 104 may include any number of word lines. Each word line may include one or more storage elements. For example, the word line 106 includes representative storage elements, such as a first storage element 109 and a second storage element 110. Each word line may include one or more pages, such as one or more physical pages. A word line may be configurable to operate as a single-level-cell (SLC) word line, as a multi-level-cell (MLC) word line, or as a tri-level-cell (TLC) word line, as illustrative, non-limiting examples. To illustrate, each storage element of a particular word line may be configured to be programmed to a corresponding threshold voltage (e.g., a voltage state) that represents a single bit value or a multi-bit value, such as a two bit value, a three bit value, a four bit value, etc.

The memory device 103 may include support circuitry, such as read/write (R/W) circuitry 105, to support operation of one or more memory dies of the memory device 103. Although depicted as a single component, the read/write circuitry 105 may be divided into separate components of the memory device 103, such as read circuitry and write circuitry. The write circuitry may be configured to program each of the multiple storage elements to a corresponding voltage state. The read circuitry may be configured to perform a read operation on the multiple storage elements to determine, for each storage element, a read group of bits corresponding to a programmed voltage state of the storage element. The R/W circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory device 103 may be coupled via a bus 120 to the controller 130. For example, the bus 120 may include one or more channels to enable the controller 130 to communicate with a single memory die of the memory device 103. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 160 and to send data to the access device 160. For example, the controller 130 may send data to the access device 160 via the communication path 179, and the controller 130 may receive data from the access device 160 via the communication path 179. The controller 130 is configured to send data and commands to the memory 104 and to receive data from the memory 104. For example, the controller 130 is configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The encoder 140 is configured to receive input data 163. The input data 163 may be logically or physically partitioned by the encoder 140 into multiple groups of bits (e.g., multiple m-tuples). The encoder 140 may map at least one input group of bits of the input data 163 to generate output data including at least one output group of bits. For example, the encoder 140 may include an encode mapper 142 configured to map the at least one input group of bits to a corresponding output group of bits using an encode mapping table 143. The encode mapping table 143 may include a static encode mapping table or a dynamic encode mapping table (based on frequency of occurrence of different groups of bits in the input data 163), as described further herein. An illustrative example of the encoder 140 is described with reference to FIG. 4.

As illustrated, the input data 163 may include a first group of bits 164, such as a first m-tuple. The first group of bits 164 may include a sequence of multiple bits, such as a first bit (B1), a second bit (B2), and a third bit (B3). Although the first group of bits 164 is described as including three bits, in other implementations, the first group of bits 164 may include two bits or more than three bits. The output group of bits of the encoder 140 may include a second group of bits 165, such as a second m-tuple. The second group of bits 165 may include a sequence of multiple bits, such as a fourth bit (B4), a fifth bit (B5), and a sixth bit (B6). Although the second group of bits 165 is described as including three bits, in other implementations, the second group of bits 165 may include two bits or more than three bits. In some implementations, each input group of bits and each output group of bits has the same number of bits. In other implementations, a particular input group of bits may have fewer bits than a particular output group of bits. For example, in implementations where it is acceptable to reduce storage capacity of a memory to reduce wear, a particular input group of bits may have fewer bits than a particular output group of bits. To illustrate, a particular input group of bits may have two bits and a particular output group of bits may have three bits. A two bit value may be associated with one of four voltage states (e.g., Er, A, B, and C) and a three bit value may be associated with one of eight voltage states (e.g., Er, A, B, C, D, E, F, and G). The two bit value (of the particular input group of bits) may be mapped to one of the four lowest voltage states of the possible eight voltage states (of a three bits value). By mapping the input group of bits to one of the four lowest voltage states of the possible eight, wear on the memory may be reduced.

The buffers 132 may include multiple buffers, such as multiple sets of buffers. For example, the buffers 132 may include a first set of buffers and a second set of buffers. The first set of buffers may include a first write buffer 133, a second write buffer 134, and a third write buffer 135. The first set of buffers may be configured to receive encoded data (e.g., write data) from the encoder 140 to be stored in the memory 104. For example, the first set of buffers may be configured to store data to be programmed to a word line of the memory 104, such as the word line 106 of the memory 104. To illustrate, the first write buffer 133 may be associated with a first logical page (e.g., an upper logic page) of the word line 106, the second write buffer 134 may be associated with a second logical page (e.g., a middle logical page) of the word line 106, and the third write buffer 135 may be associated with a third logical page (e.g., a lower logical page) of the word line 106.

The second set of buffers may include a first read buffer 136, a second read buffer 137, and a third read buffer 138. The second set of buffers may be configured to receive read data from the memory 104 to be provided to the decoder 144. For example, the second set of buffers may be configured to store read data (e.g., a representation of data stored at the word line 106) from the memory 104. To illustrate, the first read buffer 136 may be associated with a first logical page (e.g., an upper logic page) of the word line 106, the second read buffer 137 may be associated with a second logical page (e.g., a middle logical page) of the word line 106, and the third read buffer 138 may be associated with a third logical page (e.g., a lower logical page) of the word line 106.

Although the buffers 132 are described as including multiple sets of buffers, in some implementations, the buffers 132 may include a single set of buffers. The single set of buffers may be configured to receive encoded data (e.g., write data) from the encoder 140 to be stored in the memory 104 and to receive read data from the memory 104 to be provided to the decoder 144. Although each of the first set of buffers and the second set of buffers is described as including three buffers, in other implementations, the first set of buffers or the second set of buffers may include a different number of buffers, such as two buffers or more than three buffers. In some implementations, each buffer of the buffers 132 includes the same type of buffer, such as a first-in first-out (FIFO) buffer type or a first-in last-out (FILO) buffer type, as illustrative, non-limiting examples.

The decoder 144 is configured to receive read data, such as the read data 170 stored in the second set of buffers 136-138. The read data 170 may include multiple groups of bits (e.g., multiple m-tuples). The decoder 144 may map at least one group of bits of the read data 170 to generate output data 174 including at least one output group of bits. For example, the decoder 144 may include a decode mapper 146 configured to map the at least one group of bits (of the read data 170) to a corresponding output group of bits using a decode mapping table 147. The decode mapping table 147 may include a static encode mapping table or a dynamic encode mapping table (based on frequency of occurrence of different groups of bits in the read data 170), as described further herein. An illustrative example of the decoder 144 is described with reference to FIG. 5.

As illustrated, the read data 170 may include a third group of bits 172, such as a third m-tuple. The third group of bits 172 may include a sequence of multiple bits, such as a seventh bit (B7), an eighth bit (B8), and a ninth bit (B9). The third group of bits 172 may be representative of a voltage state of a storage element of the memory 104, such as the storage element 109 of the word line 106. Although the third group of bits 172 is described as including three bits, in other implementations, the third group of bits 172 may include two bits or more than three bits. The output data 174 may include a fourth group of bits 173, such as a fourth m-tuple. The fourth group of bits 173 may include a sequence of multiple bits, such as a tenth bit (B10), an eleventh bit (B11), and a twelfth bit (B12). Although the fourth group of bits 173 is described as including three bits, in other implementations, the fourth group of bits 173 may include two bits or more than three bits. In some implementations, each input group of bits of the read data 170 and each output group of bits of the output data 174 has the same number of bits. In other implementations, a particular input group of bits of the read data 170 and a particular output group of bits of the output data 174 may have a different number of bits.

The state counter 150 may be configured to count how many times an m-tuple of bits occurs in a sequence of bits, such as the input data 163 or the read data 170. To illustrate, for m=3, the state counter 150 may count how many times "111" occurs in the input data 163. In some implementations, the state counter 150 may include multiple counters and each counter may track occurrences of a different m-tuple. The multiple state counters may be used to generate a histogram of occurrences of different m-tuples in the sequence of bits, as described with reference to FIGS. 2-5.

The memory 148 may be coupled to the encoder 140 and to the decoder 144. The memory 148 may include a mapping table(s) 151 and word line meta data 152. The mapping table(s) 151 may include one or more mapping tables, such as the encode mapping table 143 or the decode mapping table 147.

The word line meta data 152 may include one or more entries associated with the memory 104. For example, each entry of the one or more entries may correspond to a different word line of the memory 104. Each entry may include frequency table initialization data, dummy data, or both. The frequency table initialization data may include a key value that is applied to a mapping table to initialize (e.g., randomize) the mapping table. For example, a key value of the word line 106 may be applied to the encode mapping table 143 to initialize the encode mapping table 143 to be used to encode the input data 163 to be stored at the word line 106. As another example, the key value of the word line may be applied to the decode mapping table 147 to initialize (e.g., randomize) the decode mapping table 147 to be used to decode the read data 170 and generate the output data 174. The key value may cause encoded data (to be stored at a particular word line) to depend from an input bit stream and to also depend on the particular word line. Additionally, using different key values for different word lines may resolve a bit line bias for repeated data programmed across multiple consecutive word lines.

The dummy data may be included in an input data stream to be stored at a word line of the memory 104. For example, the dummy data may be inserted at the beginning, at the end, or in the middle of the input data 163 to be stored at the word line 106. When the dummy data is applied to the input data 163 (e.g., an input data stream), the dummy data may be encoded by the encoder 140 and the encoded dummy data may be stored to the word line 106. As another example, dummy data may be applied during encoding and may not be stored in the word line 106. To illustrate, the encoder 140 may apply a known pattern of dummy data during encoding of the input data 163.

The decoder 144 may also account for the dummy data (e.g., the encoded dummy data stored at the memory 104) when decoding read data, such as the read data 170, from the memory 104. For example, the decoder 144 may decode read data (e.g., encoded dummy data) and may discard the decoded dummy data. As another example, if dummy data was applied during encoding (e.g., applied using a pattern), the same pattern may be used during decoding to identify and remove the dummy data. Adding the dummy data that corresponds to the destination word line to the input data stream causes encoded data for a particular word line to depend on the input data stream and to also depend on the dummy data (which corresponds to the particular word line). The dummy data may include any number of bits, such as a single bit or multiple bits.

During operation, the data storage device 102 may receive a write command from the access device 160. The write command may be associated with or include the input data 163 to be written to the memory 104. Responsive to the write command, the input data 163 (or a version thereof) may be provided to the encoder 140. In some implementations, the encode mapping table 143 may be initialized responsive to the write command.

The input data 163 may be partitioned into sub-strings of length m, where m is a predefined integer. The encode mapper 142 may map each input m-tuple, such as the first group of bits 164, using the encode mapping table 143 to generate a corresponding encoded m-tuple, such as the second group of bits 165. For example, the encoder 140 may receive the first group of bits 164 and may map the first group of bits 164 to the second group of bits 165 (e.g., an encoded m-tuple).

In some implementations, the encode mapping table 143 may be a dynamic mapping table that is updated based on the state counter 150 (or multiple state counters), as described with reference to FIG. 2. The dynamic mapping table may cause one or more input m-tuples to be mapped to encoded m-tuples based on a number of occurrences of the one or more input m-tuples in the input data 163. For example, m-tuples that occur more frequently may be mapped to encoded m-tuples that correspond to low voltage states. In case of a tie, the encoded m-tuple value can be decided in any specified way, such as by using a random choice.

The encoder 140 may send each encoded m-tuple to the first set of buffers 133-135. For example, the first set of buffers (e.g., the buffers 133-135) may receive and store the second group of bits 165. To illustrate, each buffer of the first set of buffers (e.g., buffers 133-135) may receive a different bit of the second group of bits 165. For example, the first write buffer 133 may receive and store the fourth bit B4, the second write buffer 134 may store the fifth bit B5, and the third write buffer 135 may store the sixth bit B6. The second group of bits 165 stored at the first set of buffers 133-135 may constitute a set of bits 167 to be programmed to a storage element of the memory 104, such as the first storage element 109 of the memory 104. For example, the set of bits 167 may be included in the write data 168 that is sent to the memory device 103 to be programmed to the word line 106.

Additionally or alternatively, the data storage device 102 may receive a read command from the access device 160. The read command may be associated with or correspond to the word line 106. In some implementations, the decode mapping table 147 may be initialized responsive to the read command. Responsive to the read command, the memory device 103 may perform a read operation to read the word line 106 to generate the read data 170. The memory device 103 may send the read data 170 to the controller 130.

The controller 130 may store the read data 170 at the buffers 132. To illustrate, each buffer of the second set of buffers (e.g., buffers 136-138) may receive a portion of the read data 170. A set of bits 171 stored at the second set of buffers may be representative of a voltage state stored at a storage element, such as the storage element 109, of the word line 106. For example, the set of bits 171 may include the first read buffer 136 having the seventh bit B7, the second read buffer 137 may store the eighth bit B8, and the third read buffer 138 may store the ninth bit B9. The second set of buffers may send one or more m-tuples to the decoder 144. For example, the second set of buffers may send the third group of bits 172 (that correspond to the third group of bits 172) to the decoder 144.

The decoder 144 may receive the third group of bits 172 and apply a mapping (e.g., a transformation) to the third group of bits 172 to generate the fourth group of bits 173. For example, the decode mapper 146 may map each read m-tuple, such as the third group of bits 172 using the decode mapping table 147 to generate a corresponding output m-tuple, such as the fourth group of bits 173.

Coding (e.g., encoding and decoding) described herein may include a low-complexity process that may be applied on-the-fly to a data stream. The encoding (and decoding) described herein may be performed independent of any pre-preprocessing, such as shaping, scrambling, or compression, that may be performed on data prior to the data being received by the encoder 140. The encoded data may be generated and stored such that storage elements of the memory 104 are programmed to voltage states that correspond to encoded m-tuples output by the encoder 140. By programming the storage elements to the voltage states corresponding to the encoded m-tuples, the storage elements may be programmed (on average) to lower threshold voltage levels which may reduce stress on the storage elements and thus increase an endurance limit of the memory 104.

In some implementations, in response to the write command, the controller 130 (e.g., the encoder 140) may retrieve the word line meta data 152 from the memory 148. The encoder 140 may use the word line meta data 152 to encode the input data 163 (or a version thereof). For example, the encoder 140 may use the word line meta data 152 to initialize the encode mapping table 143. Additionally or alternatively, in response to the read command, the controller 130 (e.g., the decoder 144) may retrieve the word line meta data 152 from the memory 148. The decoder 144 may use the word line meta data 152 to decode the read data 170 to generate the output data 174. For example, the decoder 144 may use the word line meta data 152 to initialize the decode mapping table 147.

In some implementations, a state count value, the mapping table(s) 151, the word line meta data 152, or a combination thereof, may be stored at the memory 104. In other implementations, the controller 130 may include or may be coupled to a particular memory, such as a random access memory (RAM), that is configured to store a state count value, the mapping table(s) 151, the word line meta data 152, or a combination thereof. In some implementations, the particular memory may include the memory 148. Alternatively, or in addition, the controller 130 may include or may be coupled to another memory (not shown), such as a non-volatile memory, a RAM, or a read only memory (ROM). The other memory may be configured to store a state count value, the mapping table(s) 151, the word line meta data 152, or a combination thereof. The other memory may be a single memory component, multiple distinct memory components, and/or may include multiple different types (e.g., volatile memory and/or non-volatile) of memory components. In some implementations, the other memory may be included in the access device 160.

In some implementations, the controller 130 may include an error correction code (ECC) engine. The ECC engine may take the form of a packaged functional hardware unit designed for use with other components, a portion of a program code (e.g., software or firmware) executable by a (micro)processor or processing circuitry, or a self-contained hardware or software component that interfaces with a larger system, as illustrative, non-limiting examples.

The ECC engine may include an encoder configured to encode one or more data words using an ECC encoding technique. For example, the ECC engine may receive encoded data (generated by the encoder 140) and may generate a codeword. To illustrate, the ECC engine may receive first encoded data stored at the first write buffer 133 and may generate a first codeword, may receive second encoded data stored at the second write buffer 134 and may generate a second codeword, and may receive third encoded data stored at the third write buffer 135 and may generate a third codeword. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may also include a decoder configured to decode data read from the memory 104 to detect and correct, up to an error correction capability of the ECC scheme, bit errors that may be present in the data. To illustrate, the ECC engine may receive the read data 170 from the memory device 103 and may store ECC decoded data that is stored at the second set of buffers 136-138. For example, the ECC engine may decode a representation of a first codeword read from the word line 106 and may store a first decoded codeword at the first read buffer 136. As another example, the ECC engine may decode a representation of a second codeword read from the word line 106 and may store a second decoded codeword at the second read buffer 137.

In some implementations, the data storage device 102 may be attached to or embedded within one or more access devices, such as within a housing of the access device 160. For example, the data storage device 102 may be embedded within the access device 160, such as in accordance with a Joint Electron Devices Engineering Council (JEDEC) Solid State Technology Association Universal Flash Storage (UFS) configuration. For example, the data storage device 102 may be configured to be coupled to the access device 160 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a mini SD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). To further illustrate, the data storage device 102 may be integrated within an apparatus (e.g., the access device 160 or another device), such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In other implementations, the data storage device 102 may be implemented in a portable device configured to be selectively coupled to one or more external access devices. For example, the data storage device 102 may be removable from the access device 160 (i.e., "removably" coupled to the access device 160). As an example, the data storage device 102 may be removably coupled to the access device 160 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

In some implementations, the data storage device 102 may include or correspond to a solid state drive (SSD) which may be included in, or distinct from (and accessible to), the access device 160. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 160 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 160 may be configured to communicate using one or more protocols, such as an eMMC protocol, a universal flash storage (UFS) protocol, a universal serial bus (USB) protocol, a serial advanced technology attachment (SATA) protocol, a peripheral component interconnect express (PCIe), a non-volatile memory express (NVMe), and/or another protocol, as illustrative, non-limiting examples.

Although one or more components of the data storage device 102 have been described with respect to the controller 130, in other implementations, certain components may be included in the memory device 103 (e.g., the memory 104). For example, the ECC engine, the encoder 140, the decoder 144, or the buffers 132 (e.g., the first set of buffers or the second set of buffers), or a combination thereof may be included in the memory device 103. Alternatively, or in addition, one or more functions as described above with reference to the controller 130 may be performed at or by the memory device 103. For example, one or more functions of the ECC engine, the encoder 140, the decoder 144, or the buffers 132 (e.g., the first set of buffers or the second set of buffers), or a combination thereof may be performed by components and/or circuitry included in the memory device 103.

Alternatively, or in addition, one or more components of the data storage device 102 may be included in the access device 160. For example, one or more of the ECC engine, the encoder 140, the decoder 144, or the buffers 132 (e.g., the first set of buffers or the second set of buffers), or a combination thereof may be included in the access device 160. Alternatively, or in addition, one or more functions, as described above with reference to the controller 130, may be performed at or by the access device 160. As an illustrative, non-limiting example, the access device 160 may be configured to encode data (as described with reference to the encoder 140) and may provide the encoded data to the data storage device 102 as the data 162.

Coding (e.g., encoding and decoding) described herein may include a low-complexity process that may be applied on-the-fly to a data stream. For example, decoding (performed by the decoder 144) may produce a corresponding output data stream which depends on an input data stream received at the decoder 144 without using side information. Additionally, encoding (performed by the encoder 140) may produce a corresponding output data stream which depends on an input data stream received at the encoder 140 without using side information. The encoded data may be generated and stored such that storage elements of the memory 104 are programmed to voltage states that correspond to encoded m-tuples output by the encoder 140. By programming the storage elements to the voltage states corresponding to the encoded m-tuples, the storage elements may be programmed (on average) to lower threshold voltage levels which may reduce stress on the storage elements and thus increase an endurance limit of the memory 104.

Figure 2:
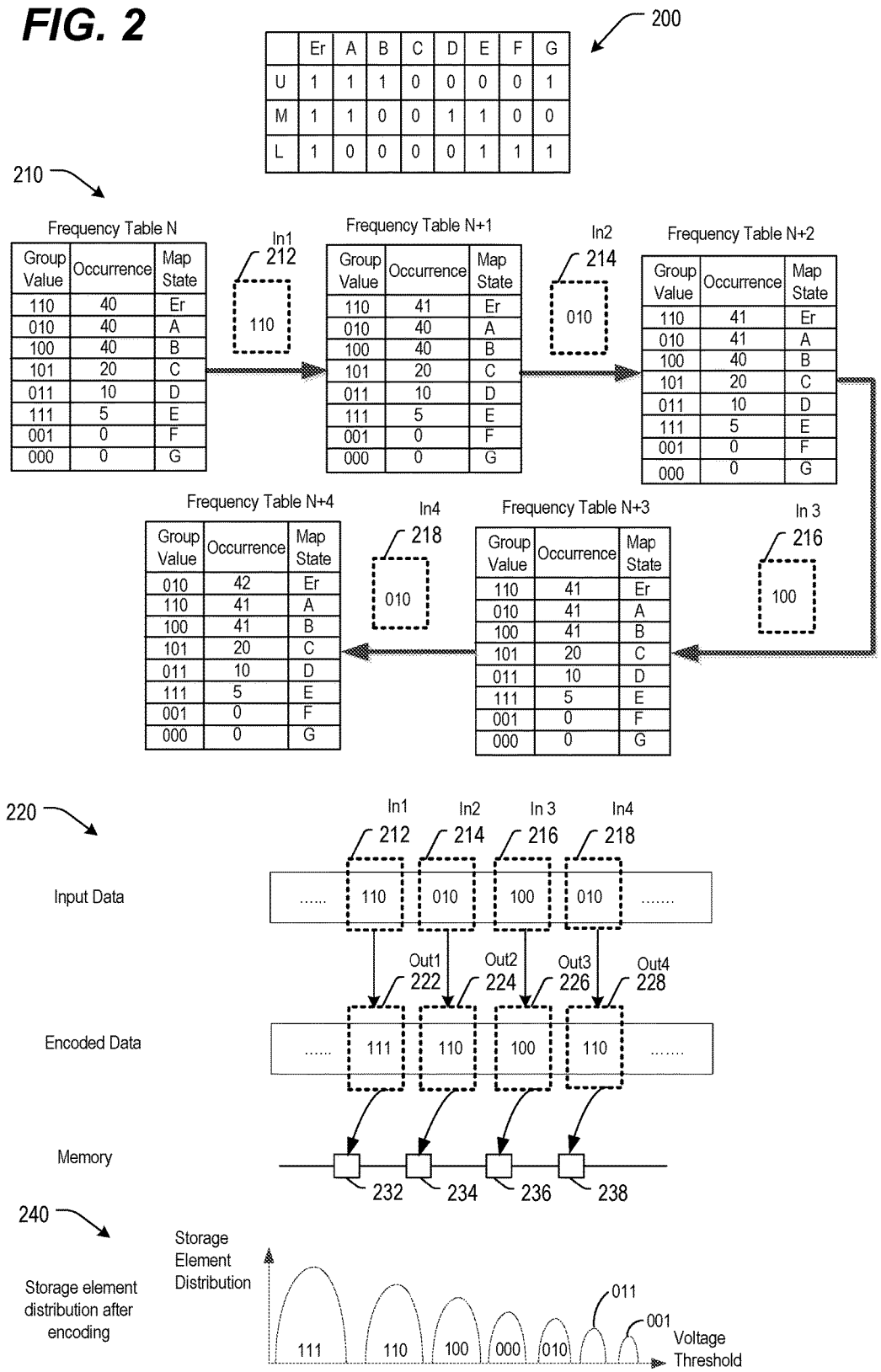
FIG. 2 is a general diagram illustrating an example of adaptive encoding.

Referring to FIG. 2, an illustrative example of adaptive encoding is depicted. A mapping 200 maps three bit values to different voltage states. The three bit values may include "111", "110", "100", "000", "010", "011", "001", and "101". Each bit of a particular three bit value is associated with a different logical page, such as an upper logical page (U), a middle logical page (M), and a lower logical page (L). In some implementations, a bit value associated with the upper logical page (U) may correspond to a most significant bit value and another bit value associated with the lower logical page (L) may correspond to a least significant value.

The voltage states may include a first state (Er), a second state (A), a third state (B), a fourth state (C), a fifth state (D), a sixth state (E), a seventh state (F), and an eighth state (G). In some implementation, voltage states may range in voltage level from the first state (Er) (e.g., a lowest voltage state) to the eighth state (G) (e.g., a highest voltage state). The first state (Er) may correspond to a value of "111", the second state (A) may correspond to a value of "110", the third state (B) may correspond to a value of "100", and the fourth state (C) may correspond to a value of "000". The fifth state (D) may correspond to a value of "010", the sixth state (E) may correspond to a value of "011", the seventh state (F) may correspond to a value of "001", and the eighth state (G) may correspond to a value of "101".

An example 210 of adaptive encoding of an input data stream (e.g., input data) illustrates a dynamic encoding mapping table that is updated based a frequency of m-tuples included in the input data stream. For example, the input data stream may include or correspond to the input data 163 of FIG. 1. The dynamic encoding mapping table may be updated so that frequently occurring m-tuple values are mapped to low voltage states as described with reference to the mapping 200. The dynamic encoding mapping table may include or correspond to the encode mapping table 143 of FIG. 1.

A first encoding mapping table N (where N is a positive integer) includes three columns having headings "Group Value", "Occurrences", and "Map State". The Group Value column may indicate bit values of input m-tuples that may be received. The Occurrences column may indicate a number of times a particular input m-tuple has been received. The Map State may indicate an output voltage state (e.g., an encoded m-tuple) that a corresponding Group Value is to be mapped to.

As indicated by the first encoding mapping table N, one hundred fifty-five input m-tuples have been received. The first encoding mapping table N is arranged so that the frequently occurring Group Values are mapped to low voltage states. In some implementations, prior to receiving any input m-tuples, a particular encoding mapping table may have been initialized to a pre-defined order. In some implementations, initializing the particular encoding mapping table may also include setting each of the Occurrence values to a corresponding value, such as zero.

A first input m-tuple (In1) 212 having a value of "110" is received and the first encoding mapping table N is used to encode the first input m-tuple (In1) 212. As illustrated in an illustration 220, based on the first encoding mapping table N, the first input m-tuple (In1) 212 is mapped to the first state (Er) corresponding to an encoded m-tuple (e.g., a first output m-tuple (Out1) 222) having a value of "111". In response to the first input m-tuple (In1) 212 having a value of "110", an occurrence count of the Group Value corresponding to "110" is incremented to generate an updated encoding mapping table (e.g., a second encoding mapping table N+1). To illustrate, the second encoding mapping table N+1 may be an updated version (e.g., a modified version) of the first encoding mapping table N. In some implementations the first input m-tuple (In1) 212 and the first output m-tuple (Out1) 222 may include or correspond to the first group of bits 164 and the second group of bits 165, respectively.

A second input m-tuple (In2) 214 having a value of "010" is received and the second encoding mapping table N+1 is used to encode the second input m-tuple (In2) 214. To illustrate, based on the second encoding mapping table N+1, the second input m-tuple (In2) 214 is mapped to the second state (A) corresponding to an encoded m-tuple (e.g., a second output m-tuple (Out2) 224) having a value of "110". In response to the second input m-tuple (In2) 214 having a value of "010", an occurrence count of the Group Value corresponding to "010" is incremented to generate an updated encoding mapping table (e.g., a third encoding mapping table N+2).

A third input m-tuple (In3) 216 having a value of "100" is received and the third encoding mapping table N+2 is used to encode the third input m-tuple (In3) 216. To illustrate, based on the third encoding mapping table N+2, the third input m-tuple (In3) 216 is mapped to the third state (B) corresponding to an encoded m-tuple (e.g., a third output m-tuple (Out3) 226) having a value of "100". In response to the third input m-tuple (In3) 216 having a value of "100", an occurrence count of the Group Value corresponding to "100" is incremented to generate an updated encoding mapping table (e.g., a fourth encoding mapping table N+3).

A fourth input m-tuple (In4) 218 having a value of "010" is received and the fourth encoding mapping table N+3 is used to encode the fourth input m-tuple (In4) 218. To illustrate, based on the fourth encoding mapping table N+3, the fourth input m-tuple (In4) 218 is mapped to the second state (A) corresponding to an encoded m-tuple (e.g., a fourth output m-tuple (Out4) 228) having a value of "110". In response to the fourth input m-tuple (In4) 218 having a value of "010", an occurrence count of the Group Value corresponding to "010" is incremented to generate an updated encoding mapping table (e.g., a fifth encoding mapping table N+4). It is noted that the Group Values have been re-arranged in the fifth encoding mapping table N+4 based on Occurrence values as compared to the fourth encoding mapping table N+3.

If another m-tuple having a value of "010" is received, it may be mapped using the fourth encoding mapping table N+3 to generate an encoded m-tuple having a value of "111". In this manner, most frequently occurring m-tuples are mapped to lowest threshold voltage states on-the-fly. Each of the output m-tuples 222-228 may correspond to a different voltage state to be programmed to a storage element of a memory, such as the memory 104. For example, the first output m-tuple (Out1) 222 may correspond to the first voltage state (Er) to be programmed at a first storage element 232. The second output m-tuple (Out2) 224 may correspond to the second voltage state (A) to be programmed at a second storage element 234. The third output m-tuple (Out3) 226 may correspond to the third voltage state (B) to be programmed at a third storage element 236. The fourth output m-tuple (Out4) 228 may correspond to the second voltage state (A) to be programmed at a fourth storage element 238.

An illustrative example 240 of storage element distribution after adaptive encoding represents the distribution of storage elements in a word line of a memory (e.g., the memory 104) across the different voltage thresholds after an input data stream is encoded using adaptive encoding. The encoding method results in more storage elements being programmed lower voltage thresholds and fewer storage elements being programmed to higher voltage thresholds.

Figure 3:
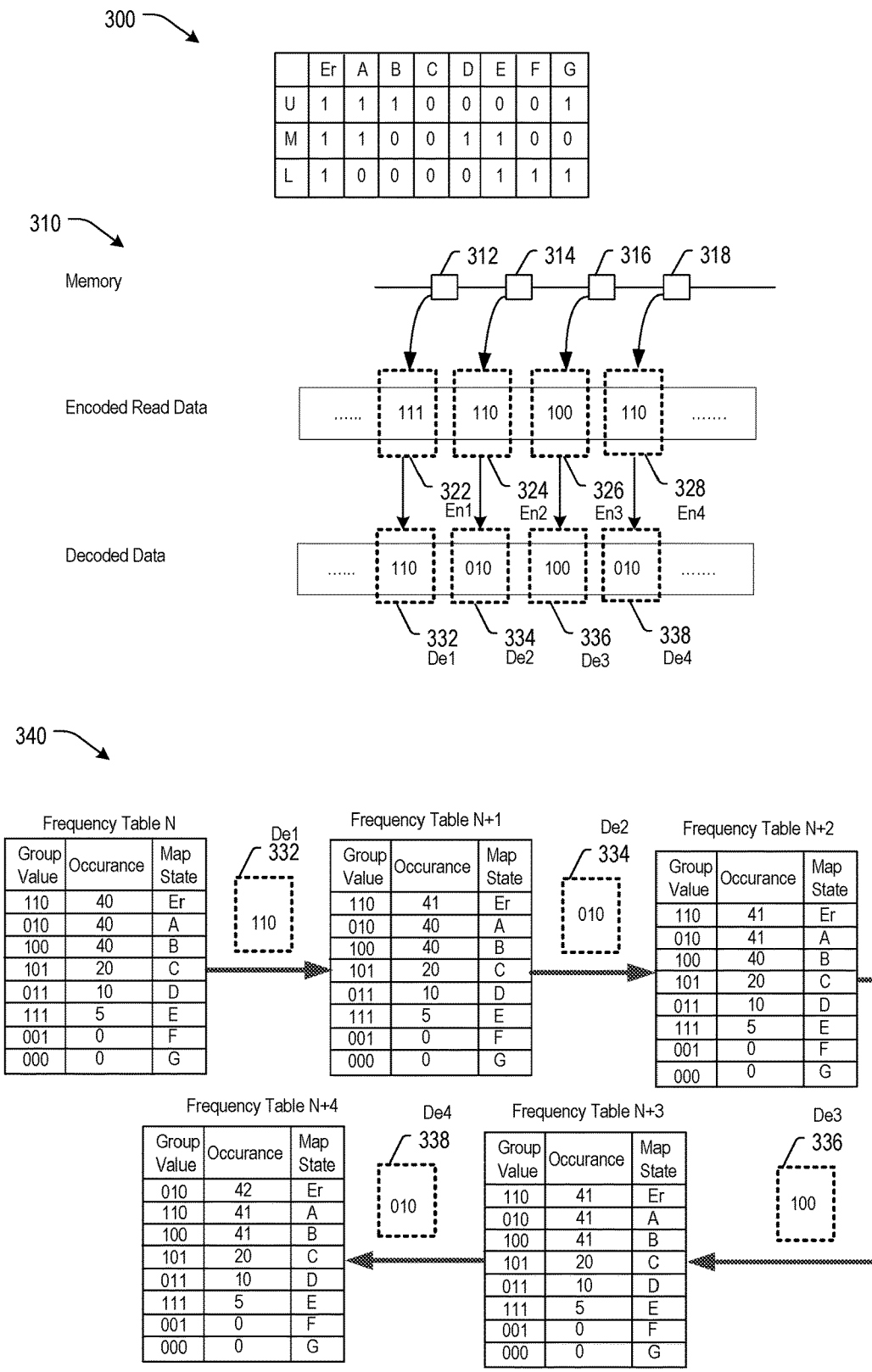
FIG. 3 is a general diagram illustrating an example of adaptive decoding.

Referring to FIG. 3, an illustrative example of adaptive decoding is depicted. A mapping 300 maps three bit values to different voltage states. The mapping 300 may include or correspond to the mapping 200 of FIG. 2.

An illustration example of reading storage elements and decoding read data (e.g., a representation of encoded data) is depicted at 310. A memory, such as the memory 104 of FIG. 1, may include multiple storage elements 312-318. Each of the storage elements 312-318 may be programmed to a corresponding voltage state. A read operation may be performed on the storage elements 312-318 to generate read data (e.g., a representation of encoded data programmed in the storage elements 312-318). For example, the read data may include or correspond to the read data 170 of FIG. 1. The read data may include a first read m-tuple (En1) 322 associated with a first storage element 312, a second read m-tuple (En2) 324 associated with a second storage element 314, a third read m-tuple (En3) 326 associated with a third storage element 316, and a fourth read m-tuple (En4) 328 associated with a fourth storage element 318.

Each of the read m-tuples 322-328 may correspond to a different voltage state. For example, the first read m-tuple (En1) 322 may be associated with a first state (Er), the second read m-tuple (En2) 324 may be associated with a second voltage state (A), the third read m-tuple (En3) 326 may be associated with a third voltage state (B), and the fourth read m-tuple (En4) 328 may be associated with the second voltage state (A).

The read data (e.g., the read m-tuples 322-328) may be decoded to generate decoded data, as described further herein. For example, the read data may be decoded by a decoder, such as the decoder 144 of FIG. 1 and the decoded data may include or correspond to the output data 174 of FIG. 1. To illustrate, the first read m-tuple (En1) 322 may be decoded to generate a first decoded m-tuple (De1) 332, the second read m-tuple (En2) 324 may be decoded to generate a second decoded m-tuple (De2) 334, the third read m-tuple (En3) 326 may be decoded to generate a third decoded m-tuple (De3) 336 and the fourth read m-tuple (En4) 328 may be decoded to generate a fourth decoded m-tuple (De4) 338.

An example 340 of adaptive decoding of an input data stream (e.g., read data) illustrates a dynamic decoding mapping table that is update based a frequency of m-tuples included in the input data stream. For example, the input data stream may include or correspond to the read data 170 of FIG. 1. The dynamic decoding mapping table may be updated so that frequently occurring m-tuple values are mapped to low voltage states as described with reference to the mapping 300. The dynamic decoding mapping table may include or correspond to the decode mapping table 147 of FIG. 1.

A first decoding mapping table N (where N is a positive integer) includes three columns having headings "Group Value", "Occurrences", and "Map State". The Map State may indicate a voltage state (e.g., a read m-tuple value) that may be received from the memory. The Group Value column may indicate bit values of decoded m-tuples that may be output based on a received read m-tuple. The Occurrences column may indicate a number of times a particular decode m-tuple has been output.

As indicated by the first decoding mapping table N, one hundred fifty-five input m-tuples have been received. The first decoding mapping table N is arranged so that the frequently occurring Group Values are mapped to low voltage states. In some implementations, prior to receiving any read m-tuples, a particular decoding mapping table may have been initialized to a pre-defined order. In some implementations, initializing the particular decoding mapping table may also include setting each of the Occurrence values to a corresponding value, such as zero.

The first read m-tuple (En1) 322 having a value of "111" (corresponding to a first voltage state (Er)) is received and the first decoding mapping table N is used to decode the first read m-tuple (En1) 322. To illustrate, based on the first decoding mapping table N, the first read m-tuple (En1) 322 is mapped from the first voltage state (Er) to a decoded m-tuple (De1) 332 having a value of "110". In response to the first decode m-tuple (De1) 332, an occurrence count of the Group Value corresponding to the Group Value "110" is incremented to generate an updated decoding mapping table (e.g., a second decoding mapping table N+1). To illustrate, the second decoding mapping table N+1 may be an updated version (e.g., a modified version) of the first decoding mapping table N. In some implementations the first read m-tuple (En1) 322 and the first decode m-tuple (De1) 332 may include or correspond to the third group of bits 172 and the fourth group of bits 173, respectively.

The second read m-tuple (En2) 324 having a value of "110" (corresponding to a second voltage state (A)) is received and the second decoding mapping table N+1 is used to decode the second read m-tuple (En2) 324. To illustrate, based on the second decoding mapping table N+1, the second read m-tuple (En2) 324 is mapped from the second voltage state (A) to a second decoded m-tuple (De2) 334 having a value of "010". In response to the second decode m-tuple (De2) 334, an occurrence count of the Group Value corresponding to the Group Value "010" is incremented to generate an updated decoding mapping table (e.g., a third decoding mapping table N+2).

The third read m-tuple (En3) 326 having a value of "100" (corresponding to a third voltage state (B)) is received and the third decoding mapping table N+2 is used to decode the third read m-tuple (En3) 326. To illustrate, based on the third decoding mapping table N+2, the third read m-tuple (En3) 326 is mapped from the third voltage state (B) to the third decode m-tuple (De3) 336 having a value of "100". In response to the third decode m-tuple (De3) 336 having a value of "100", an occurrence count of the Group Value corresponding to "100" is incremented to generate an updated decoding mapping table (e.g., a fourth decoding mapping table N+3).

A fourth read m-tuple (En4) 328 having a value of "110" (corresponding to the second voltage state (A)) is received and the fourth decoding mapping table N+3 is used to decode the fourth read m-tuple (En4) 328. To illustrate, based on the fourth decoding mapping table N+3, the fourth read m-tuple (En4) 328 is mapped from the second voltage state to the fourth decode m-tuple (De4) 338 having a value of "010". In response to the fourth decode m-tuple (De4) 338 having a value of "010", an occurrence count of the Group Value corresponding to "010" is incremented to generate an updated decoding mapping table (e.g., a fifth decoding mapping table N+4). It is noted that the Group Values have been re-arranged in the fifth encoding mapping table N+4 based on Occurrence values as compared to the fourth encoding mapping table N+3.

Thus, as described with reference to FIGS. 2-3 encoding frequency tables and decoding frequency tables may be adjusted to enable adaptive encoding and adaptive decoding. For example, the adaptive decoding may decode data that was encoded using the adaptive encoding. Additionally, adjustment of the decoding frequency table corresponding to the encoding frequency table may enable adaptive encode and corresponding decode to be performed without storing side information corresponding to the states of or changes to the frequency table.

Figure 4:
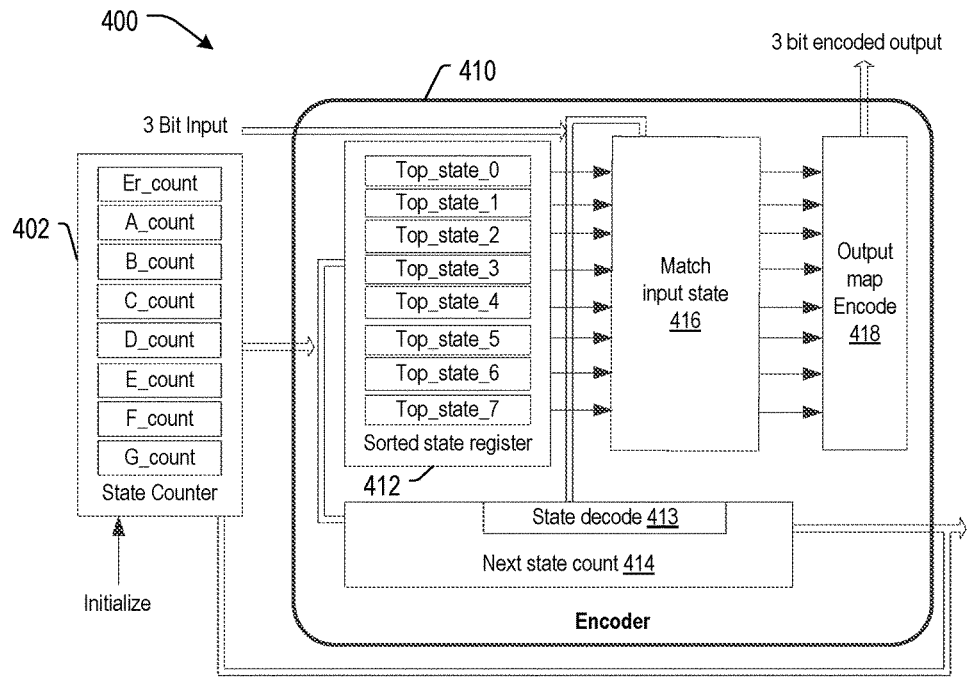
FIG. 4 is a block diagram illustrating an example of an encoder.

Referring to FIG. 4, an example of a system 400 that includes an encoder is depicted. The system 400 includes a state counter 402 and an encoder 410. The state counter 402, the encoder 410, or both may be included in a data storage device or an access device, such as the data storage device 102 or the access device 160 of FIG. 1, as illustrative, non-limiting examples.

The state counter 402 include one or more count values configured to count how many times an m-tuple of bits (or a corresponding voltage state) occurs in a sequence of bits. For example, the state counter 402 may include or correspond to the state counter 150 of FIG. 1 or may be associated with Occurrence values described with reference to the example 210 of FIG. 2. The sequence of bits may include or correspond to the input data 163 of FIG. 1 or the input data described with reference to FIG. 2.

The state counter 402 may be configured to receive an initialize signal configured to set each of the count values to a corresponding value. For example, each of the count values may be set to zero. As another example, one or more of the count values may be set to a value based on word line data, such as the word line meta data 152 of FIG. 1. The state counter 402 may be configured to count how many times an m-tuple of bits occurs in a sequence of bits responsive to one or more state indications received from the encoder 410 as described further herein. The state counter 402 may also be configured to provide the count values to the encoder 410.

For example, in response to being initialized, the state counter 402 may provide the initialized count values to the encoder 410 (e.g., a sorted state register 412). Although described as being separate from the encoder 410, in other implementations, the state counter 402 may be included in the encoder 410.

The encoder 410 may include the sorted state register 412, a match input state component 416, an output map encode component 418, a state decode component 413, and a next state count component 414. The sorted state register 412 may be configured to receive the count values from the state counter 402 and to sort (e.g., arrange) multiple voltage states in an order based on the count values. For example, the voltage states may be arranged so that a first entry (e.g., Top_state_0) is set to a first voltage state corresponding to a highest count value and a second entry (e.g., Top_state_7) is set to a second voltage state corresponding to a lowest count value. The sorted state register 412 may be updated (e.g., re-ordered) responsive to one or more count values of the state counter 402 changing.

The encoder 410 may be configured to receive an input m-tuple, such as a three bit input. For example, the input m-tuple may include or correspond to the first group of bits 164 of FIG. 1. The input m-tuple may be provided to the match input state component 416 and to the state decode component 413. The state decode component 413 may be configured to determine a voltage state corresponding to the input m-tuple. The next state count component 414 may be configured to send one or more state indications to the state counter 402 to indicate the voltage state (that corresponds to the input m-tuple) determined by the state decode component 413.

The match input state component 416 may be configured to receive the input m-tuple and to match the input m-tuple to one of the ordered voltage states of the sorted state register 412. The match input state component 416 may be configured to indicate a match to the output map encode component 418. The output map encode component 418 may generate an encoded m-tuple (e.g., a three bit encoded output) responsive to the indicated match. The encoded m-tuple may include or correspond to the second group of bits 165.

Figure 5:
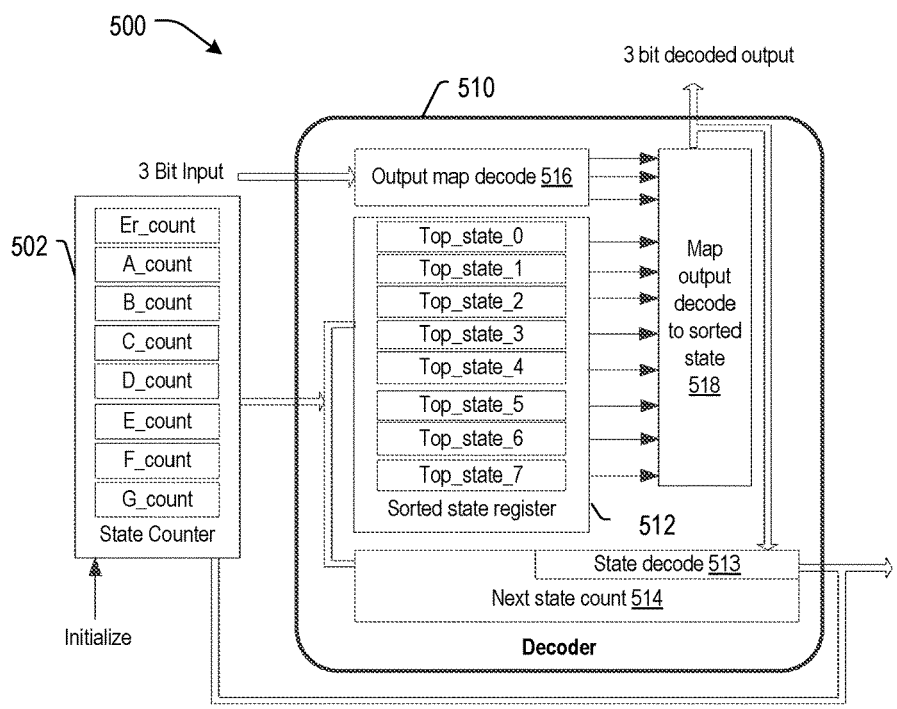
FIG. 5 is a block diagram illustrating an example of a decoder.

Referring to FIG. 5, an example of a system 500 that includes a decoder is depicted. The system 500 includes a state counter 502 and a decoder 510. The state counter 502, the decoder 510, or both may be included in a data storage device or an access device, such as the data storage device 102 or the access device 160 of FIG. 1, as illustrative, non-limiting examples.

The state counter 502 may include one or more count values configured to count how many times a decoded m-tuple of bits (or a corresponding voltage state) is output by the decoder 510. For example, the state counter 502 may include or correspond to the state counter 150 of FIG. 1 or may be associated with Occurrence values described with reference to the example 340 of FIG. 3. The decoded m-tuple of bits may include or correspond to the fourth group of bits 173, the output data 174 of FIG. 1, or the decoded data as described with reference to the example 310 of FIG. 3.

The state counter 502 may be configured to receive an initialize signal configured to set each of the count values to a corresponding value. For example, each of the count values may be set to zero. As another example, one or more of the count values may be set to a value based on word line data, such as the word line meta data 152 of FIG. 1. The state counter 502 may be configured to count how many times a decoded m-tuple of bits is output by the decoder 510 as described further herein. The state counter 502 may also be configured to provide the count values to the decoder 510. For example, in response to being initialized, the state counter 502 may provide the initialized count values to the decoder 510 (e.g., a sorted state register 512). Although described as being separate from the decoder 510, in other implementations, the state counter 502 may be included in the decoder 510.

The decoder 510 may include the sorted state register 512, an output map decode component 516, a map output decode to sorted state component 518, a state decode component 513, and a next state count component 514. The sorted state register 512 may be configured to receive the count values from the state counter 502 and to sort (e.g., arrange) multiple voltage states in an order based on the count values. For example, the voltage states may be arranged so that a first entry (e.g., Top_state_0) is set to a first voltage state corresponding to a highest count value and a second entry (e.g., Top_state_7) is set to a second voltage state corresponding to a lowest count value. The sorted state register 512 may be updated (e.g., re-ordered) responsive to one or more count values of the state counter 502 changing.

The decoder 510 may be configured to receive an input m-tuple, such as a three bit input. For example, the input m-tuple may include or correspond to the read data or the third group of bits 172 of FIG. 1 or the encoded read data described with reference to the example 310 of FIG. 3. The input m-tuple may be provided to the output map decode component 516 that is configured to determine individual bit values of the input m-tuple (or a voltage state corresponding to the input m-tuple). The output map decode to sorted state component 518 may generate a decoded m-tuple (e.g., a three bit decoded output) responsive to an output received from the output map decode component 516.

The state decode component 513 may be configured to determine a voltage state corresponding to the decoded m-tuple. The next state count component 514 may be configured to send one or more state indications to the state counter 502 to indicate the voltage state (that corresponds to the decoded m-tuple) determined by the state decode component 513.

Figure 6:
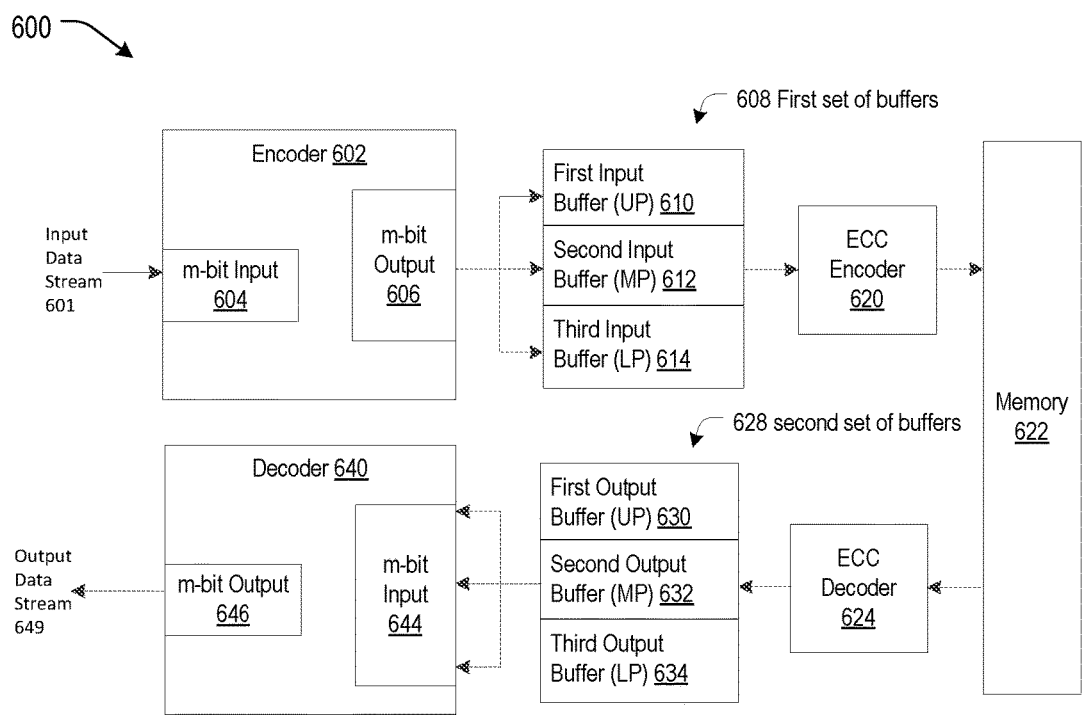
FIG. 6 is a block diagram of another example of a system operative to perform shaping transformation coding.

Referring to FIG. 6, a system 600 configured to perform encoding and decoding is depicted. The system 600 may include or correspond to the data storage device 102, the access device 160, or both, of FIG. 1. The system 600 may include an encoder 602, a first set of buffers 608, an ECC encoder 620, a memory 622, an ECC decoder 624, a second set of buffers 628, and a decoder 640.

The encoder 602 may include or correspond to the encoder 140 of FIG. 1 or the encoder 410 of FIG. 4. The encoder 602 may include a first m-bit input 604 and a first m-bit output 606. The first m-bit input 604 may be configured to serially receive bits of an input data stream 601, such as an input m-tuple. The input data stream (e.g., the input m-tuple) may include or correspond to the data 162, the input data 163, the first group of bits 164 of FIG. 1, the input data 212-218 of FIG. 2, or the input data described with reference to FIG. 4. The first m-bit output 606 may be configured to output multiple bits of an encoded m-tuple in parallel to the first set of buffers 608. The encoded m-tuple may include or correspond to the second group of bits 165, the encoded data 222-228 of FIG. 2, or the encoded data described with reference to FIG. 4.

The first set of buffers 608 may include a first input buffer (UP) 610, a second input buffer (MP) 612, and a third input buffer (LP) 614. For example, the first input buffer (UP) 610 may include or correspond to the first write buffer 133, the second input buffer (MP) 612 may include or correspond to the second write buffer 134, and the third input buffer (LP) 614 may include or correspond to the third write buffer 135. In some implementations, each buffer of the first set of buffers 608 is configured as a FIFO buffer. Each buffer of the first set of buffers 608 may be associated with a different logical page of a word line of the memory 622. Additionally, each buffer of the first set of buffers 608 may be configured to receive a different bit of an encoded m-tuple output by the encoder 602 via the first m-bit output 606.

Data (e.g., bit values) in each buffer (of the first set of buffers 608) is sent to the ECC encoder 620 and an ECC encoded version of the data is transferred from the ECC encoder 620 to latches (not shown) of the memory 622. The memory 622 may include or correspond to the memory device 103 or the memory 104 of FIG. 1. From the latches, write circuitry of the memory 622 programs one or more storage elements of the memory 622 based on the ECC encoded version of the data.

After the encoded version of the data is programmed in the memory 622, read circuitry of the memory 622 may perform a read operation to on the one or more storage elements to generate read data, such as the read data 170 of FIG. 1 or the encoded read data 322-328 of the example 310 of FIG. 3. The read data may be sent from the memory 622 to the ECC decoder 624. The ECC decoder 624 may generate error corrected read data that is sent to the second set of buffers 628.

The second set of buffers 628 may include a first output buffer (UP) 630, a second output buffer (MP) 632, and a third output buffer (LP) 634. For example, the first output buffer (UP) 630 may include or correspond to the first read buffer 136, the second output buffer (MP) 632 may include or correspond to the second read buffer 137, and the third output buffer (LP) 634 may include or correspond to the third read buffer 138. In some implementations, each buffer of the second set of buffers 628 is configured as a FIFO buffer. Each buffer of the second set of buffers 628 may be associated with a different logical page of a word line of the memory 622. Additionally, each buffer of the second set of buffers 608 may be configured to store a different bit of an encoded m-tuple to be provided to the decoder 640. For example, each bit of the encoded m-tuple may be provided in parallel from the second set of buffers 628 to the decoder 640. The encoded m-tuple may include or correspond to the read data 170, the third group of bits 172 of FIG. 1, or the encoded read data 322-328 described with reference to the example 310 of FIG. 3.

The decoder 640 may include or correspond to the decoder 144 of FIG. 1 or the decoder 510 of FIG. 5. The decoder 640 may include a second m-bit input 644 and a second m-bit output 646. The second m-bit input 644 may be configured to receive each bit of the encoded m-tuple in parallel from the second set of buffers 628. The second m-bit output 646 may be configured to serially output multiple bits of a decoded m-tuple as an output data stream 649. The decoded m-tuple may include or correspond to the fourth group of bits 173, the output data 174, the data 162 of FIG. 1, the decoded data 332-338 of FIG. 3, or the decoded data described with reference to FIG. 5.

In some implementations, data scrambling, data encoding, data compression, or a combination thereof may be perform by the system 600 to generate the input data stream 601. Additionally or alternatively, the system 600 may be configured to perform data descrambling, data decoding, data decompression, or a combination thereof on the output data stream 649 that is output by the decoder 640 via the second m-bit output 646.

Figure 7:
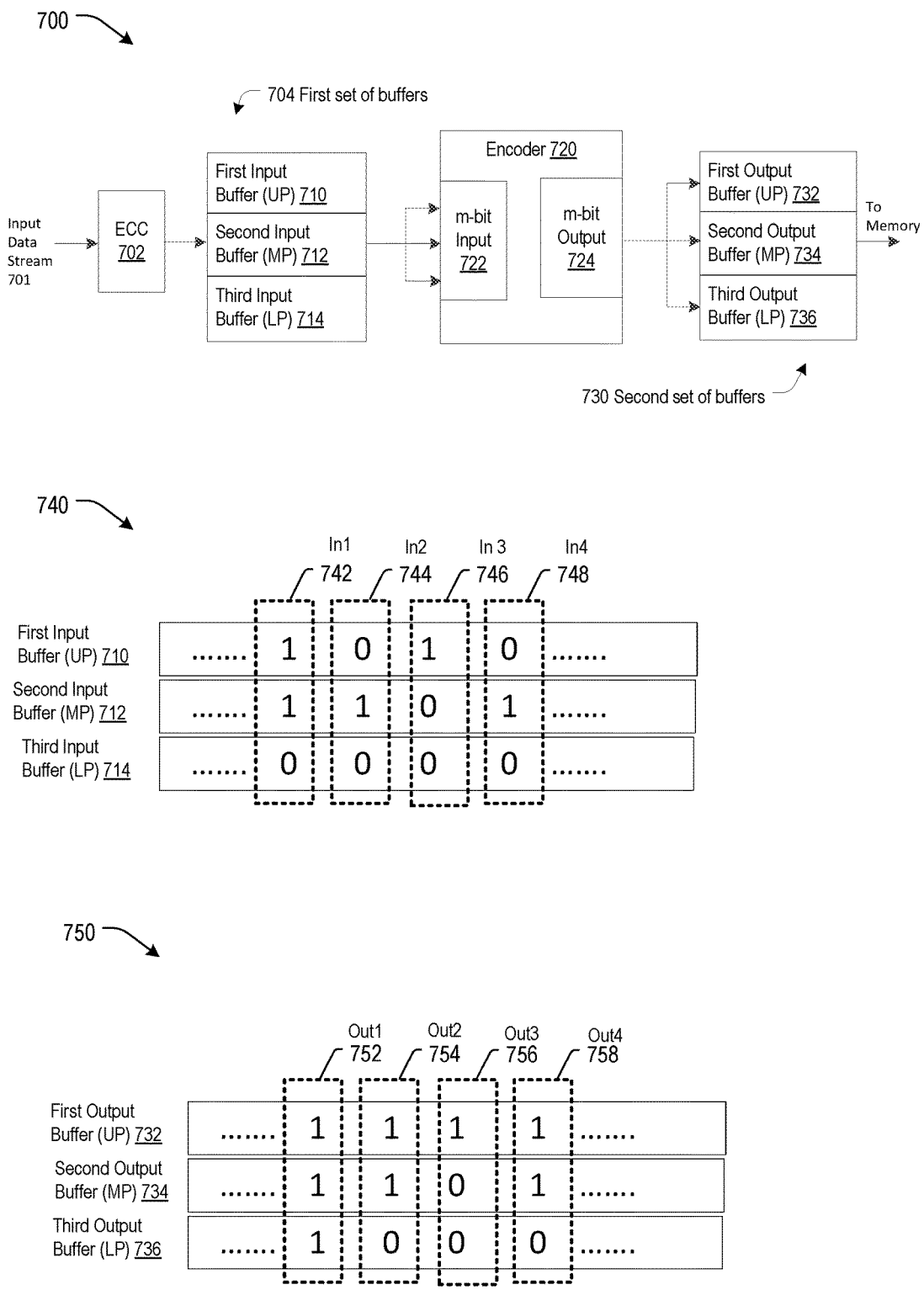
FIG. 7 is a general diagram illustrating another example of performing shaping transformation encoding.

Referring to FIG. 7, an illustrative example of adaptive encoding is depicted. A system 700 configured to perform encoding may include or correspond to the data storage device 102, the access device 160 of FIG. 1, or the system 600 of FIG. 6. The system 700 may include an ECC encoder 702, a first set of buffers 704, an encoder 720, and a second set of buffers 730.

The ECC encoder 702 may be configured to receive an input data stream 701 and to encode the input data stream 701 to generate one or more codewords. For example, the ECC encoder 702 may be configured to serially receive bits of the input data stream 701. The input data stream 701 may include or correspond to the data 162, the input data 163. The ECC encoder 702 may provide the one or more codewords to the first set of buffers 704.

The first set of buffers 704 may include a first input buffer (UP) 710, a second input buffer (MP) 712, and a third input buffer (LP) 714. In some implementations, each buffer of the first set of buffers 704 is configured as a FIFO buffer. Each buffer of the first set of buffers 704 may be associated with a different logical page of a word line of a memory, such as the memory 104 or the memory 622. Additionally, each buffer of the first set of buffers 704 may be configured to receive a different codeword from the ECC encoder 702. For example, the first input buffer 710 may receive a first codeword, a second input buffer 712 may receive a second codeword, and a third input buffer 714 may receive a third codeword.

The first set of buffers 704 may be configured to provide input m-tuples to the encoder 720. Each input m-tuple may include a bit from each of the first set of buffers 704 and each of the bits of the m-tuple may be provided in parallel to the encoder 720.

The encoder 720 may include or correspond to the encoder 140 of FIG. 1, the encoder 410 of FIG. 4, or the encoder 602 of FIG. 6. The encoder 720 may include an m-bit input 722 and an m-bit output 724. The m-bit input 722 may be configured to receive bits of an input m-tuple in parallel from different buffers of the first set of buffers 704. The input m-tuple may include or correspond to the data 162, the input data 163, the first group of bits 164 of FIG. 1, the input data 212-218 of FIG. 2, or the input data described with reference to FIG. 4. The m-bit output 724 may be configured to output multiple bits of an encoded m-tuple in parallel to the second set of buffers 730. The encoded m-tuple may include or correspond to the second group of bits 165, the encoded data 222-228 of FIG. 2, or the encoded data described with reference to FIG. 4.

The second set of buffers 730 may include a first output buffer (UP) 732, a second output buffer (MP) 734, and a third output buffer (LP) 736. For example, the first output buffer (UP) 732 may include or correspond to the first write buffer 133, the second output buffer (MP) 734 may include or correspond to the second write buffer 134, and the third output buffer (LP) 736 may include or correspond to the third write buffer 135. In some implementations, each buffer of the second set of buffers 730 is configured as a FIFO buffer. Each buffer of the second set of buffers 730 may be associated with a different logical page of a word line of the memory. Additionally, each buffer of the second set of buffers 730 may be configured to receive a different bit of an encoded m-tuple output by the encoder 720 via the m-bit output 724. Data (e.g., bit values) in each buffer (of the second set of buffers 730) may be sent to latches (not shown) of the memory to be used to program one or more storage elements of the memory.

An example 740 depicts input data (e.g., ECC encoded input data) stored at the first set of buffers 704. The input data includes a first input m-tuple (In1) 742, a second input m-tuple (In2) 744, a third input m-tuple (In3) 746, and a fourth input m-tuple (In4) 748. Each input m-tuple may be provided to the encoder 720 via the m-bit input 722. The encoder 720 may map each input m-tuple to a corresponding output m-tuple. Each output m-tuple may be provided to the second set of buffers 730 via the m-bit output 724.

An example 750 depicts output data stored at the second set of buffers 730. The output data includes a first output m-tuple (Out1) 752, a second output m-tuple (Out2) 754, a third output m-tuple (Out3) 756, and a fourth output m-tuple (Out4) 758. Each output m-tuple may correspond to a different input m-tuple received at the encoder 720. For example, the first output m-tuple (Out1) 752 corresponds to the first input m-tuple (In1) 742, the second output m-tuple (Out2) 754 corresponds to the second input m-tuple (In2) 744, the third output m-tuple (Out3) 756 corresponds to the third input m-tuple (In3) 746, and the fourth output m-tuple (Out4) 758 corresponds to the fourth input m-tuple (In4) 748.

Figure 8:
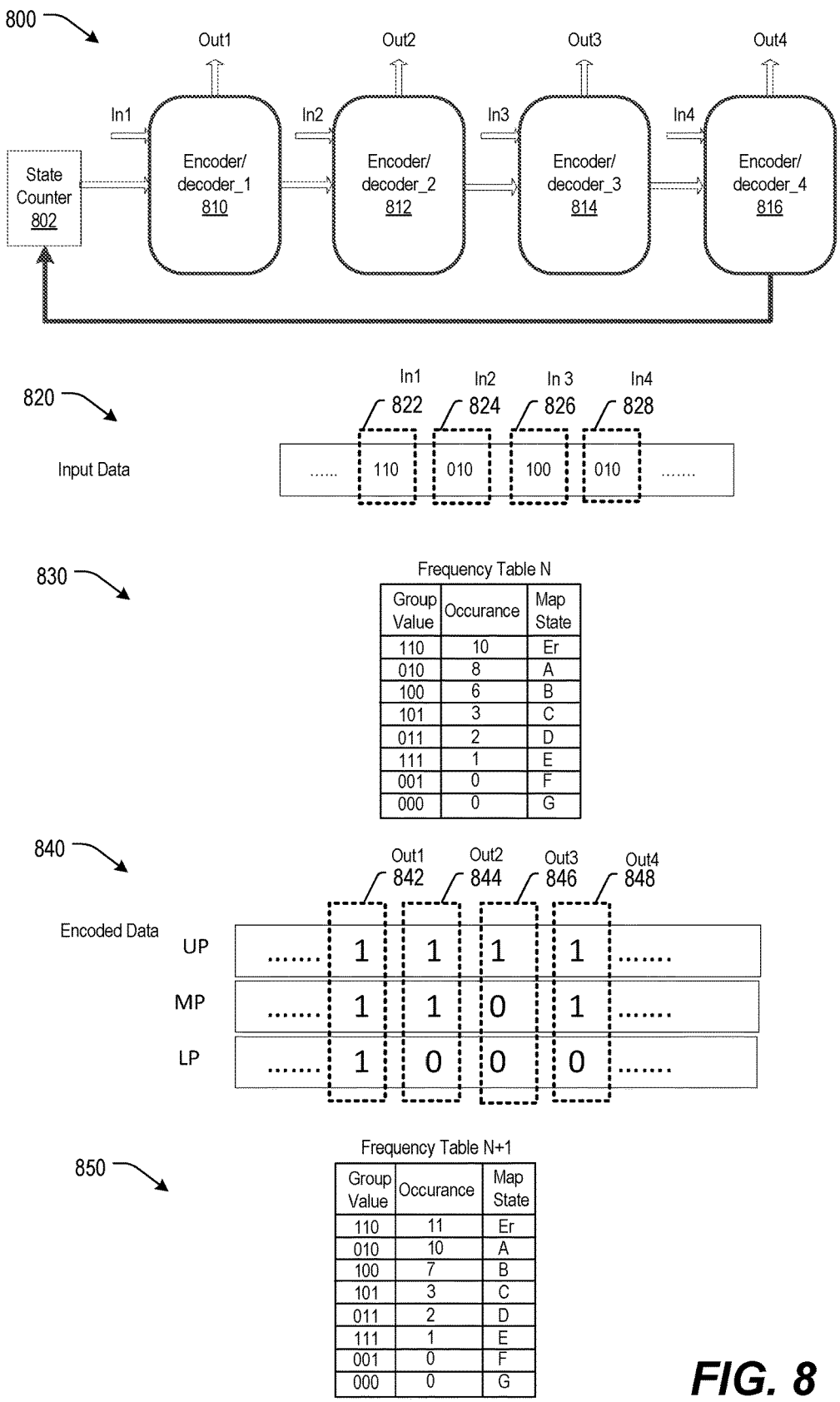
FIG. 8 is a general diagram illustrating an example of performing shaping transformation encoding.

Referring to FIG. 8, an illustrative example of adaptive encoding or adaptive decoding is depicted. For example, a system 800 may include multiple encoders/decoders that are cascaded to perform adaptive encoding or adaptive decoding. A number of encoders/decoders included in the multiple encoders/decoders may depend on a design of the system 800. The system 800 configured to perform coding (e.g., encoding, decoding, or both) may include or correspond to the data storage device 102, the access device 160 of FIG. 1, the system 600 of FIG. 6, or the system 700 of FIG. 7.

The system 800 may include a state counter 802 and a set of encoders/decoders 810-816. Each encoder/decoder of the set of encoders/decoders 810-816 may be cascaded to enable the system 800 to process multiple m-tuples, as described further herein. In some implementations, each of the encoders/decoders 810-816 may include an encoder, such as the encoder 140 of FIG. 1, the encoder 410 of FIG. 4, the encoder 602 of FIG. 6, or the encoder 720 of FIG. 7. In other implementations, each of the encoders/decoders 810-816 may include a decoder, such as the decoder 144 of FIG. 1, the decoder 510 of FIG. 5, or the decoder 640 of FIG. 6. In other implementations, each of the set of encoders/decoders 810-816 may include an encoder and a decoder.

During a coding iteration, each of the set of encoders/decoders 810-816 may be configured to receive input data (e.g., an input m-tuple) of an input data stream, map the input data based on state count values (or updated state count values) associated with a frequency mapping table to generate output data (e.g., an output m-tuple), and output the output data. For example, a first encoder/decoder_1 810 may be configured to receive first input data (In1) (e.g., a first input m-tuple) and to generate first output data (Out1) (e.g., a first output m-tuple). A second encoder/decoder_2 812 may be configured to receive second input data (In2) (e.g., a second input m-tuple) and to generate second output data (Out2) (e.g., a second output m-tuple). A third encoder/decoder_3 814 may be configured to receive third input data (In3) (e.g., a third input m-tuple) and to generate third output data (Out3) (e.g., a third output m-tuple). A fourth encoder/decoder_4 816 may be configured to receive fourth input data (In4) (e.g., a fourth input m-tuple) and to generate fourth output data (Out4) (e.g., a fourth output m-tuple). The input data stream may include or correspond to the data 162, the input data 163, the read data 170 of FIG. 1, the input data 212-218 of FIG. 2, the encoded read data 322-328 of FIG. 3, the input data described with reference to FIG. 4, the input data described with reference to FIG. 5, the input data stream 601, input data received via the m-bit input 644 of the decoder 640 of FIG. 6, or data received via the m-bit input 722 of the encoder 720 of FIG. 7.

When the set of encoders/decoders 810-816 is configured to perform encoding, each encoder/decoder may determine a voltage state corresponding to received input data. For example, each of the encoders 810-816 may be configured to operate as described with reference to the encoder 410 of FIG. 4. Each of the encoders 810-816 is further configured to provided updated state counter values to a next encoder (or to the state counter 802) according to the cascaded configuration. To illustrate, during an encoding iteration of the system 800, the first encoder/decoder_1 810 may provide receive first state count values from the state counter 802 and may determine a first voltage state associated with first input data (In1). The first encoder/decoder_1 810 may update (based on the first voltage state) the first state count values to generate second state count values. The first encoder/decoder_1 810 may provide the second state count values to the second encoder/decoder_2 812.

The second encoder/decoder_2 812 may receive the second state count values and may determine a second voltage state associated with second input data (In2). The second encoder/decoder_2 812 may update (based on the second voltage state) the second state count values to generate third state count values. The second encoder/decoder_2 812 may provide the third state count values to the third encoder/decoder_3 814. The third encoder/decoder_3 814 may receive the third state count values and may determine a third voltage state associated with third input data (In3). The third encoder/decoder_3 814 may update (based on the third voltage state) the third state count values to generate fourth state count values. The third encoder/decoder_3 814 may provide the fourth state count values to the fourth encoder/decoder_4 816.

The fourth encoder/decoder_4 816 may receive the fourth state count values and may determine a fourth voltage state associated with fourth input data (In4). The fourth encoder/decoder_4 816 may update (based on the fourth voltage state) the fourth state count values to generate fifth state count values. The fourth encoder/decoder_4 816 may provide the fifth state count values to the state counter 802. The fifth state count values may be provided to the first encoder/decoder_1 810 for use during a subsequent (e.g., a next) encoding iteration of the system 800. When the set of encoders/decoders 810-816 is configured to perform decoding, each encoder/decoder may determine a voltage state corresponding to generated output data and may provide to a next encoder/decoder or to the state counter 802 based on the configuration of the system 800.

The state counter 802 may include one or more count values configured to count how many times an m-tuple of bits (or a corresponding voltage state) occurs in a sequence of bits, such an input data stream. The state counter 802 may include or correspond to the state counter 150 of FIG. 1, the state counter 402 of FIG. 4, or the state counter 502 of FIG. 5.

An illustration example 820 of input data to be encoded by the set of encoders/decoders 810-816 during a coding iteration is depicted. In some implementations, each encoder/decoder may be configured to compute an encoded m-tuple (or a decoded tuple) during a coding iteration. For example, each encoder/decoder may be configured to compute an encoded m-tuple (or a decoded tuple) in less than a single clock cycle. A number of cascaded encoders/decoders may be determined so that a single iteration of encoding/decoding performed by the cascaded encoders/decoders may be performed during a single clock cycle. To illustrate, during a single clock cycle, the first input data (In1) 822 may be provided to the first encoder/decoder_1 810, the second input data (In2) 824 may be provided to the second encoder/decoder_2 812, the third input data (In3) 826 may be provided to the third encoder/decoder_3 814, and the fourth input data (In4) 822 may be provided to the fourth encoder/decoder_4 816.

An example 830 illustrates a first dynamic mapping table that may be used by the set of encoders/decoders 810-816 during the first coding iteration. Based on the first dynamic mapping table, each of the set of encoders/decoders 810-816 may generate corresponding output data (e.g., an encoded m-tuple).

An illustration example 840 of output data generated during the first coding iteration by the set of encoders/decoders 810-816 is depicted. To illustrate, output data (e.g., encoded data) may include the first output data (Out1) 842, the second output data (Out2) 844, the third output data (Out3) 846, and the fourth output data (Out4) 848.

An example 850 illustrates a second dynamic mapping table that may be generated based on the first coding iteration. The second dynamic mapping table may be modified version of the first dynamic mapping table. For example, the first dynamic mapping table may be updated to reflect occurrences of different m-tuples in the input data that were processed (e.g., mapped) during the first decode iteration. The second dynamic mapping table may be used by the set of encoders/decoders 810-816 during a second coding iteration. Because the encoders/decoders 810-816 are cascaded and each encoder/decoder receives updated state count values from a prior encoder/decoder, a resulting average voltage level of encoded data (that is based on the received input data) is lower than original input data.

Although four encoders/decoders are illustrated in FIG. 8, in other implementations, more than four or fewer than four encoders/decoders may be cascaded. Increased coding speed per iteration may be achieved by having more encoders/decoders cascaded, and slower coding speed per operation may be achieved by having fewer encoders/decoders cascaded. Additionally or alternatively, the encoder/decoder system may operate (e.g., complete coding of input data) faster by having more encoders/decoders cascaded, and may operate (e.g., complete coding of the input data) slower by having fewer encoders/decoders cascaded.

Figure 9:
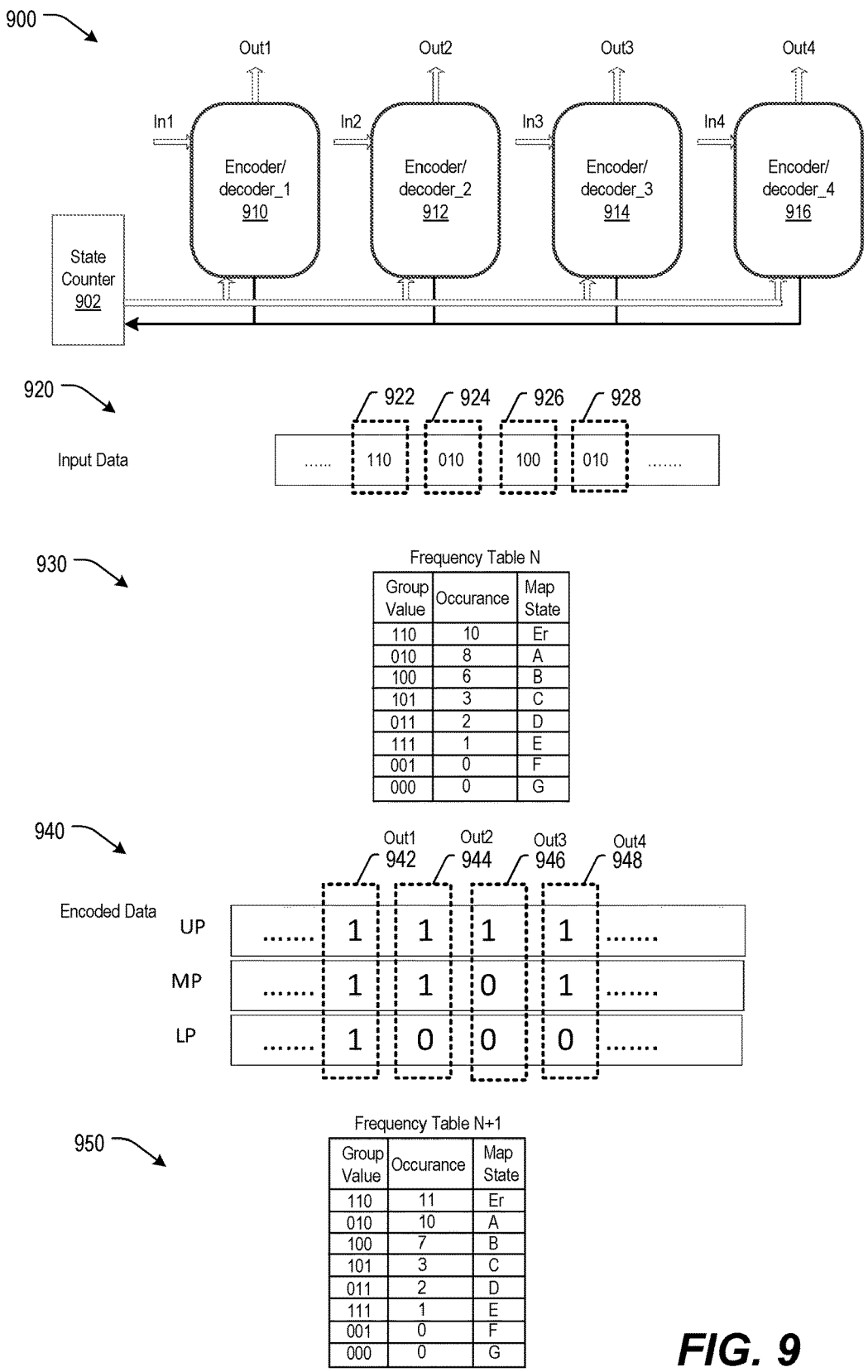
FIG. 9 is a general diagram illustrating an example of performing shaping transformation encoding.

Referring to FIG. 9, another illustrative example of adaptive encoding or adaptive decoding is depicted. For example, a system 900 may include multiple encoders/decoders that are configured in parallel to perform adaptive encoding or adaptive decoding. A number of encoders/decoders included in the multiple encoders/decoders may depend on a design of the system 900. The system 900 configured to perform coding (e.g., encoding, decoding, or both) may include or correspond to the data storage device 102, the access device 160 of FIG. 1, the system 600 of FIG. 6, or the system 700 of FIG. 7.

The system 900 may include a state counter 902 and a set of encoders/decoders 910-916. Each encoder/decoder of the set of encoders/decoders 910-916 may be configured in parallel to enable the system 900 to process multiple m-tuples, as described further herein. In some implementations, each of the encoders/decoders 910-916 may include an encoder, such as the encoder 140 of FIG. 1, the encoder 410 of FIG. 4, the encoder 602 of FIG. 6, the encoder 720 of FIG. 7, or the encoders/decoders 810-816 of FIG. 8. In other implementations, each of the encoders/decoders 910-916 may include a decoder, such as the decoder 144 of FIG. 1, the decoder 510 of FIG. 5, or the decoder 640 of FIG. 6. In other implementations, each of the set of encoders/decoders 910-916 may include an encoder and a decoder.

During a coding iteration, each of the set of encoders/decoders 910-916 may be configured to operate in parallel. For example, during a coding iteration, each of the encoders/decoders 910-916 may receive input data (e.g., an input m-tuple) of an input data stream, map the input data based on state count values of a frequency mapping table to generate output data (e.g., an output m-tuple), and output the output data. For example, a first encoder/decoder_1 910 may be configured to receive first input data (In1) (e.g., a first input m-tuple) and to generate first output data (Out1) (e.g., a first output m-tuple). A second encoder/decoder_2 912 may be configured to receive second input data (In2) (e.g., a second input m-tuple) and to generate second output data (Out2) (e.g., a second output m-tuple). A third encoder/decoder_3 914 may be configured to receive third input data (In3) (e.g., a third input m-tuple) and to generate third output data (Out3) (e.g., a third output m-tuple). A fourth encoder/decoder_4 916 may be configured to receive fourth input data (In4) (e.g., a fourth input m-tuple) and to generate fourth output data (Out4) (e.g., a fourth output m-tuple). The input data stream may include or correspond to the data 162, the input data 163, the read data 170 of FIG. 1, the input data 212-218 of FIG. 2, the encoded read data 322-328 of FIG. 3, the input data described with reference to FIG. 4, the input data described with reference to FIG. 5, the input data stream 601, input data received via the m-bit input 644 of the decoder 640 of FIG. 6, or data received via the m-bit input 722 of the encoder 720 of FIG. 7.

When the set of encoders/decoders 910-916 is configured to perform encoding, each encoder/decoder may determine (in parallel) a voltage state corresponding to received input data. For example, each of the encoders 910-916 may be configured to operate as described with reference to the encoder 410 of FIG. 4. Each of the encoders 910-916 is further configured to provide an indication of a particular voltage state (associated with input data received at the encoder) to the state counter 902.

To illustrate, during an encoding iteration of the system 900, each of the encoders/decoders 910-916 may receive first state count values from the state counter 902 and may receive corresponding input data. Each of the encoders 910-916 may, in parallel, determine a corresponding voltage state associated with input data received at the encoder/decoder and may provide an indication of the corresponding voltage state to the state counter 902. Based on the indications associated with (e.g., generated during) the coding iteration and received from the encoders/decoders 910-916 at the state counter 902, the state counter 902 may update the first state count values based on the indications to generate second state count values. The second state count values may be provided to the encoders/decoders 910-916 for use during a subsequent (e.g., a next) encoding iteration of the system 900. When the set of encoders/decoders 910-916 is configured to perform decoding in parallel, each encoder/decoder may determine a voltage state corresponding to generated output data and may provide an indication of a voltage state (associated with the output data) to the state counter 902.

The state counter 902 may include one or more count values configured to count how many times an m-tuple of bits (or a corresponding voltage state) occurs in a sequence of bits, such an input data stream. The state counter 902 may include or correspond to the state counter 150 of FIG. 1, the state counter 402 of FIG. 4, the state counter 502 of FIG. 5, or the state counter 802 of FIG. 8.

An illustration example 920 of input data to be encoded by the set of encoders/decoders 910-916 during a coding iteration is depicted. In some implementations, each encoder/decoder may be configured to compute an encoded m-tuple (or a decoded tuple) during a single clock cycle or within an amount of time that is less than a single clock cycle. Additionally, indications of the voltage states may be determined by the encoders/decoder 910-916 and provided from the encoders/decoders 910-916 to the state counter 902 during a single iteration, such as an iteration having a duration that is less than or equal to one clock cycle.

An example 930 illustrates a first dynamic mapping table that may be used by the set of encoders/decoders 910-916 during the first coding iteration. Based on the first dynamic mapping table, each of the set of encoders/decoders 910-916 may generate corresponding output data (e.g., an encoded m-tuple).

An illustration example 940 of output data generated during the first coding iteration by the set of encoders/decoders 910-916 is depicted. To illustrate, output data (e.g., encoded data) may include the first output data (Out1) 942, the second output data (Out2) 944, the third output data (Out3) 946, and the fourth output data (Out4) 948.

An example 950 illustrates a second dynamic mapping table that may be generated based on the first coding iteration. The second dynamic mapping table may be modified version of the first dynamic mapping table. For example, the first dynamic mapping table may be updated to reflect occurrences of different m-tuples in the input data that were processed (e.g., mapped) during the first coding iteration. The second dynamic mapping table may be used by the set of encoders/decoders 910-916 during a second coding iteration.

As compared to the system 800 of FIG. 8 having the encoders/decoders 810-816 in a cascaded configuration, the encoders/decoders 910-916 of the system 900 of FIG. 9 are configured in parallel. Each of the encoders/decoders 910-916 may provide data to the state counter 902 (or to multiple state counters) to enable the state counter 902 to generate updated state count values. Because the encoders/decoders 910-916 are configured in parallel and each use the same state count values for a particular coding iteration, in some implementations, the resulting average voltage level of encoded data generated by the system 900 may not be as low as the resulting average voltage level of encoded data generated by the system 800 having a cascaded configuration. Because the encoders/decoders 910-916 are configured in parallel, each encoder/decoder may not be dependent on updated state count values from a prior encoder/decoder, which may reduce timing constraints for each encoder/decoder and result in simpler to design as compared to the system 800 of FIG. 8 having a cascaded configuration.

Figure 10:
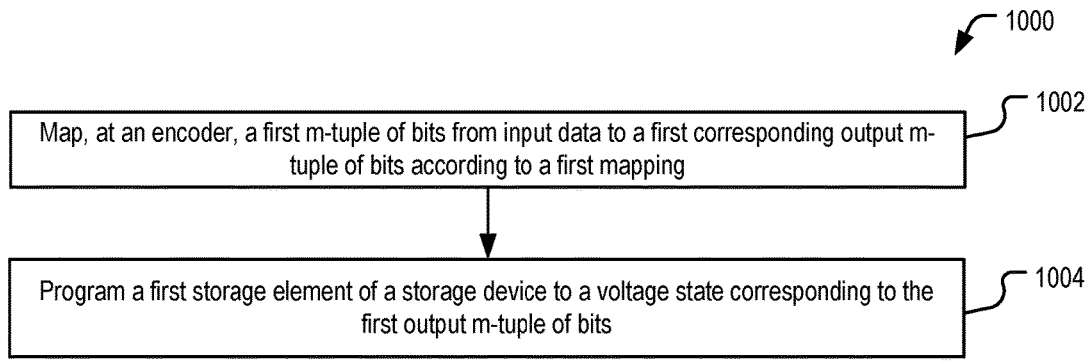
FIG. 10 is a flow diagram of an illustrative method of shaping transformation encoding.

Referring to FIG. 10, a particular illustrative example of a method 1000 of encoding is depicted. The method 1000 may be performed at the data storage device 102, such as performed by the controller 130, the access device 160 of FIG. 1, or a combination thereof, as illustrative, non-limiting examples. To illustrate, the method 1000 may be performed by the encoder 140 of FIG. 1, the encoder 410 of FIG. 4, the encoder 602 of FIG. 6, the encoder 702 of FIG. 7, one of the set of encoders/decoders 810-816 of FIG. 8, or one of the set of encoders/decoders 910-916 of FIG. 9.

The method 1000 may include mapping, at an encoder, a first m-tuple of bits from the input data to a corresponding first output m-tuple of bits using a first mapping, at 1002. The first mapping may be based on a frequency of m-bit values of one or more m-tuples of bits of the input data that precede the first m-tuple of bits. The input data may include or correspond to the data 162, the input data 163, the input data 212-218 of FIG. 2, the input data described with reference to FIG. 4, the input data stream 601 of FIG. 6, or data received via the m-bit input 722 of the encoder 720 of FIG. 7, the input data 822-828 of FIG. 8, or the input data 922-928 of FIG. 9. As an illustrative, non-limiting example, the first m-tuple and the first output m-tuple may include the first group of bits 164 and the second group of bits 165, respectively.

The method 1000 may also include programming a first storage element of a storage device to a voltage state corresponding to the first output m-tuple of bits, at 1004. The first storage element may be included in a memory, such as the memory 104 of FIG. 1 or the memory 622 of FIG. 6.

In some implementations, prior to mapping the first m-tuple of bits, the first m-tuple of bits may be received at the encoder. For example, each bit of the first m-tuple of bits may be received in parallel. As another example, the bits of the first m-tuple may be received serially (e.g., sequentially).

After mapping the first m-tuple of bits, a second mapping may be generated that maps a second m-tuple of bits to a corresponding second output m-tuple of bits. The second mapping may be generated at least partially based on the first m-tuple of bits. The second m-tuple of bits (of the input data) may be mapped to a corresponding second output m-tuple of bits according to the second mapping and a second storage element of the storage device may be programmed to a second voltage state corresponding to the second output m-tuple of bits.

In some implementations, a second m-tuple of bit of the input data may be mapped to a corresponding second output m-tuple of bits according to the first mapping and a second storage element of the storage device may be mapped to a second voltage state corresponding to the second output m-tuple of bits. After the second m-tuple of bits is mapped, a second mapping may be generated that maps a third m-tuple of bits of the input data to a corresponding third output m-tuple of bits. The second mapping may be generated at least partially based on the first m-tuple of bits and the second m-tuple of bits. Mapping the first m-tuple of bits and mapping the second m-tuple of bits may have been performed serially or in parallel.

In some implementations, prior to mapping the first m-tuple, the method 1000 may include receiving the input data. In response to receiving the input data, a frequency table configured to count occurrences of different m-tuples of bits included in the input data may be initialized. In some implementations, in response to receiving the input data, a key value of a word line (configured to store an encoded version of the input data) of the storage device may be identified. Initializing the frequency table may include setting one or more count values of the frequency table based on the key value. Additionally or alternatively, in response to receiving the input data, the method 1000 may include modifying the input data to include dummy data. The key value, the dummy data, or both may be included in or correspond to the word line meta data 152 of FIG. 1.

Coding (e.g., encoding) using the method 1000 may be a low-complexity process that may be applied on-the-fly to a data stream. For example, encoding (performed by the encoder) may produce a corresponding output data stream which depends on an input data stream received at the encoder without using side information. The encoded data may be generated and stored such that storage elements of the memory are programmed to voltage states that correspond to encoded m-tuples output by the encoder. By programming the storage elements to the voltage states corresponding to the encoded m-tuples, the storage elements may be programmed (on average) to lower threshold voltage levels which may reduce stress on the storage elements and thus increase an endurance limit of the memory.

Figure 11:
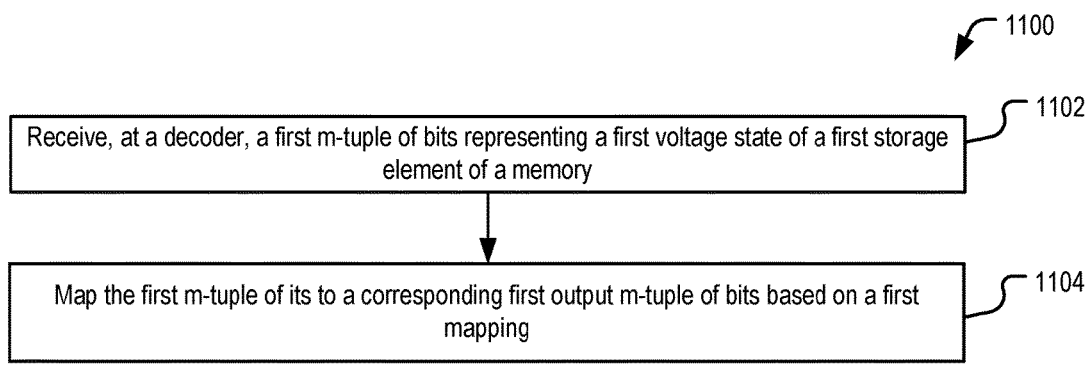
FIG. 11 is a flow diagram of an illustrative method of shaping transformation decoding.

Referring to FIG. 11, a particular illustrative example of a method 1100 of a method of decoding is depicted. The method 1100 may be performed at the data storage device 102, such as performed by the controller 130, and/or the access device 160 of FIG. 1, or a combination thereof, as illustrative, non-limiting examples. To illustrate, the method 1100 may be performed by the decoder 144 of FIG. 1, the decoder 510 of FIG. 5, the decoder 640 of FIG. 6, one of the set of encoders/decoders 810-816 of FIG. 8, or one of the set of encoders/decoders 910-916 of FIG. 9.

The method 1100 includes receiving, at a decoder, a first m-tuple of bits representing a first voltage state of a first storage element of a memory, at 1102. The first m-tuple may include or correspond to the read data 170 of FIG. 1, the encoded read data 322-328 of FIG. 3, the input data described with reference to FIG. 5, the input data received via the m-bit input 644 of the decoder 640 of FIG. 6, data received via the m-bit input 722 of the encoder 720 of FIG. 7, input data received at one of the set of encoders/decoders 810-816 of FIG. 8, or input data received at one of the set of encoders/decoders 910-916 of FIG. 9. As an illustrative, non-limiting example, the first m-tuple of bits may include the third group of bits 172.

The method 1100 also includes mapping the first m-tuple of bits to a corresponding first output m-tuple of bits based on a first mapping, at 1104. The first output m-tuple of bits may include or correspond to the fourth group of bits 173, the output data 174, the data 162 of FIG. 1, decoded output data of the decoder 510 of FIG. 5, the output data stream 649 of FIG. 6, output data generated by one of the set of encoders/decoders 810-816 of FIG. 8, or output data generated by one of the set of encoders/decoders 910-916 of FIG. 9.

In some implementations, a second mapping may be generated that maps a second m-tuple of bits to a corresponding second output m-tuple of bits. The second mapping may be generated at least partially based on the first m-tuple of bits. The second m-tuple of bits may be mapped to a corresponding second output m-tuple of bits according to the second mapping. The second m-tuple of bits representing a second voltage state of a second storage element of the memory.

In some implementations, each bit of the first m-tuple of bits may be received in parallel at a decoder from a set of buffers. For example, the set of buffers may include the second set of buffers 136-138 of FIG. 1 or the second set of buffers 628 of FIG. 6. Each buffer of the set of buffers may store a different bit of the first m-tuple of bits.

Coding (e.g., decoding) described herein may include a low-complexity process that may be applied on-the-fly to a data stream. For example, decoding (performed by the decoder) may produce a corresponding output data stream which depends on an input data stream received at the decoder without using side information. By being able to decode data received from storage elements programmed to voltage states corresponding to encoded m-tuples, the storage elements may be programmed (on average) to lower threshold voltage levels which may reduce stress on the storage elements and thus increase an endurance limit of the memory.

The method 1000 of FIG. 10 and/or the method 1100 of FIG. 11 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 1000 of FIG. 10 and/or the method 1100 of FIG. 11 can be initiated or controlled by one or more processors, such as one or more processors included in or coupled to a controller or a memory of the data storage device 102, and/or the access device 160 of FIG. 1. As an example, one or more of the methods of FIGS. 10-11, individually or in combination, may be performed by the controller 130 of FIG. 1. To illustrate, a portion of one of the methods FIGS. 10-11 may be combined with a second portion of one of the methods of FIGS. 10-11. Additionally, one or more operations described with reference to the FIGS. 10-11 may be optional, may be performed at least partially concurrently, and/or may be performed in a different order than shown or described.

Although various components of the data storage device 102, such as the controller 130 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method 1000 of FIG. 10 and/or the method 1100 of FIG. 11.

Alternatively or in addition, one or more aspects of the data storage device 102, such as the controller 130 of FIG. 1 may be implemented using a microprocessor or microcontroller programmed (e.g., by executing instructions) to perform operations described herein, such as one or more operations of the method 1000 of FIG. 10 and/or one or more operations of the method 1100 of FIG. 11, as described further herein. As an illustrative, non-limiting example, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

In some implementations, each of the controller 130, the memory device 103, and/or the access device 160 of FIG. 1 may include a processor executing instructions that are stored at a memory, such as a non-volatile memory of the data storage device 102 or the access device 160 of FIG. 1. Alternatively or additionally, executable instructions that are executed by the processor may be stored at a separate memory location that is not part of the non-volatile memory, such as at a read-only memory (ROM) of the data storage device 102 or the access device 160 of FIG. 1.

The memory 104, the memory 148, and/or the memory 622 may include a resistive random access memory (Re- RAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, a phase change memory (PCM) or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104, the memory 148, and/or the memory 622 may include another type of memory. The memory 104, the memory 148, and/or the memory 622 may include a semiconductor memory device.

Semiconductor memory devices include volatile memory devices, such as dynamic random access memory ("DRAM") or static random access memory ("SRAM") devices, non-volatile memory devices, such as magneto resistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
    an encoder coupled to a memory controller and configured to receive input data and to map, based on a frequency of occurrence of groups of bits included in the input data, at least one input group of bits of the input data to generate output data including at least one output group of bits, wherein each input group of bits of the at least one input group of bits has the same number of bits as each corresponding output group of bits of the at least one output group of bits, wherein a first input group of bits occurs more frequently in the input data than a second input group of bits; and
    a memory including multiple storage elements, each storage element of the multiple storage elements configured to be programmed to a voltage state corresponding to an output group of bits of the at least one output group of bits associated with the storage element, wherein a first voltage state corresponding to a first output group of bits mapped from the first input group of bits is lower than a second voltage state corresponding to a second output group of bits mapped from the second input group of bits.

2. The data storage device of claim 1, further comprising a decoder configured to receive a first group of read bits representative of the first voltage state of a first storage element of the multiple storage elements and to map the first group of read bits to generate a first output group of read bits, wherein each of the first group of read bits and the first output group of read bits has the same number of bits.

3. The data storage device of claim 1, further comprising multiple buffers, each buffer of the multiple buffers configured to receive a different bit of each output group of bits of the at least one output group of bits from the encoder.

4. The data storage device of claim 1, wherein the memory controller is configured to generate the input data, to provide the input data to the encoder, and to determine the frequency of occurrence of groups of bits included in the input data, and further comprising a memory device coupled to the memory controller, the memory device including the memory and write circuitry configured to program each storage element of the multiple storage elements to a corresponding voltage state.

5. The data storage device of claim 1, wherein the first voltage state and the second voltage state are based on the frequency of occurrence of groups of bits included in the input data.

6. The data storage device of claim 1, further comprising an error correction code (ECC) engine configured to generate a codeword based on the output data generated by the encoder.

7. A data storage device comprising:
    a memory coupled to a controller and including multiple storage elements, each storage element of the multiple storage elements configured to be programmed to a voltage state corresponding to a group of bits associated with the storage element, wherein a first voltage state corresponding to a first group of bits that occurs more frequently in input data than a second group of bits is lower than a second voltage state corresponding to the second group of bits; and
    a decoder configured to receive the first group of bits representing the first voltage state of a first storage element of the multiple storage elements and to map the first group of bits, based on a frequency of occurrence of groups of bits to be decoded, to generate a first output group of bits, wherein a number of bits of the first group of bits is the same as a number of bits of the first output group of bits.

8. The data storage device of claim 7, further comprising read circuitry configured to perform a read operation on the multiple storage elements to determine, for each read storage element of the multiple storage elements, the group of bits corresponding to a programmed voltage state of the read storage element.

9. The data storage device of claim 8, further comprising a memory device, the memory device including the memory and the read circuitry.

10. The data storage device of claim 7, further comprising multiple buffers coupled to the decoder, each buffer of the multiple buffers configured to provide a different bit of the first group of bits to the decoder.

11. The data storage device of claim 10, wherein each buffer of the multiple buffers comprises a first-in first-out (FIFO) buffer.

12. The data storage device of claim 10, wherein the decoder is further configured to receive each bit of the first group of bits in parallel from the multiple buffers.

13. An apparatus comprising:
    means for encoding data, the means for encoding data coupled to means for processing information and configured to receive input data and to map, based on a frequency of occurrence of groups of bits included in the input data, at least one input group of bits of the input data to generate output data including at least one output group of bits, wherein each input group of bits of the at least one input group of bits has the same number of bits as each corresponding output group of bits of the at least one output group of bits, wherein a first input group of bits occurs more frequently in the input data than a second input group of bits; and means for storing data, the means for storing data including multiple storage elements, each storage element of the multiple storage elements configured to be programmed to a voltage state corresponding to an output group of bits of the at least one output group of bits associated with the storage element, wherein a first voltage state corresponding to a first output group of bits mapped from the first input group of bits is lower than a second voltage state corresponding to a second output group of bits mapped from the second input group of bits.

14. The apparatus of claim 13, further comprising means for decoding data, the means for decoding data configured to receive a first group of read bits representative of the first voltage state of a first storage element of the multiple storage elements and to map the first group of read bits to generate a first output group of read bits, wherein each of the first group of read bits and the first output group of read bits has the same number of bits.

* * * * *